(12) United States Patent
Shero et al.

(10) Patent No.: US 7,020,981 B2
(45) Date of Patent: Apr. 4, 2006

(54) REACTION SYSTEM FOR GROWING A THIN FILM

(75) Inventors: Eric J. Shero, Phoenix, AZ (US); Mohith E. Verghese, Phoenix, AZ (US)

(73) Assignee: ASM America, INC, Pheonix, AZ (US)

( * ) Notice: Subject to any disclaimer, the term of this patent is extended or adjusted under 35 U.S.C. 154(b) by 0 days.

(21) Appl. No.: 10/977,323

(22) Filed: Oct. 29, 2004

(65) Prior Publication Data

US 2005/0241176 A1     Nov. 3, 2005

Related U.S. Application Data

(60) Provisional application No. 60/580,498, filed on Jun. 17, 2004, provisional application No. 60/573,711, filed on May 21, 2004, provisional application No. 60/515,237, filed on Oct. 29, 2003.

(51) Int. Cl.
*F26B 3/08*     (2006.01)

(52) U.S. Cl. ............... 34/366; 34/391; 34/72; 34/107; 34/202; 438/785; 118/715

(58) Field of Classification Search .............. 34/330, 34/366, 391, 443, 72, 107, 202; 118/715; 438/149, 785
See application file for complete search history.

(56) References Cited

U.S. PATENT DOCUMENTS

| | | | |
|---|---|---|---|
| 5,711,811 A | 1/1998 | Suntola et al. | |
| 6,399,510 B1 | 6/2002 | Riley et al. | |
| 6,613,695 B1 * | 9/2003 | Pomarede et al. | 438/767 |
| 6,797,617 B1 * | 9/2004 | Pomarede et al. | 438/680 |
| 6,806,211 B1 * | 10/2004 | Shinriki et al. | 438/785 |
| 2004/0026037 A1 | 2/2004 | Shinriki et al. | |

FOREIGN PATENT DOCUMENTS

| | | |
|---|---|---|
| JP | 02-074587 | 3/1990 |
| JP | 07/094419 | 4/1995 |
| WO | WO 96/17969 A2 | 6/1996 |
| WO | WO 03/081659 A1 | 10/2003 |

* cited by examiner

*Primary Examiner*—S. Gravini
(74) *Attorney, Agent, or Firm*—Knobbe, Martens, Olson & Bear, LLP

(57) ABSTRACT

A reactor defines a reaction chamber for processing a substrate. The reactor comprises a first inlet for providing a first reactant and to the reaction chamber and a second inlet for a second reactant to the reaction chamber. A first exhaust outlet removes gases from the reaction chamber. A second exhaust outlet removes gases from the reaction chamber. A flow control system is configured to alternately constrict flow through the first and second exhaust outlets. The reactor chamber is configured to for a diffusion barrier within the reaction chamber.

23 Claims, 17 Drawing Sheets

REACTION SYSTEM FOR GROWING A THIN FILM

PRIORITY INFORMATION

This application claims the priority benefit under 35 U.S.C. § 119(e) of Provisional Application No. 60/580,498, filed Jun. 17, 2004, Provisional Application No. 60/573,711, filed May 21, 2004 and Provisional Application No. 60/515,237 filed Oct. 29, 2003 and the entire contents of these applications are hereby incorporated by reference herein.

BACKGROUND OF THE INVENTION

1. Field of the Invention

The present invention relates to equipment for chemical processes. In particular, the present invention relates to equipment for growing a thin film in a reaction chamber.

2. Description of the Related Art

There are several vapor deposition methods for depositing thin films on the surface of substrates. These methods include vacuum evaporation deposition, Molecular Beam Epitaxy (MBE), different variants of Chemical Vapor Deposition (CVD) (including low-pressure and organometallic CVD and plasma-enhanced CVD), and Atomic Layer Epitaxy (ALE), which is more recently referred to as Atomic Layer Deposition (ALD).

ALD is a known process in the semiconductor industry for forming thin films of materials on substrates such as silicon wafers. ALD is a type of vapor deposition wherein a film is built up through self-saturating reactions performed in cycles. The thickness of the film is determined by the number of cycles performed. In an ALD process, gaseous precursors are supplied, alternatingly and repeatedly, to the substrate or wafer to form a thin film of material on the wafer. One reactant adsorbs in a self-limiting process on the wafer. A subsequent reactant pulse reacts with the adsorbed material to form a single molecular layer of the desired material. Decomposition may occur through reaction with an appropriately selected reagent, such as in a ligand exchange or a gettering reaction. In a typical ALD reaction, no more than a molecular monolayer forms per cycle. Thicker films are produced through repeated growth cycles until the target thickness is achieved.

In an ALD process, one or more substrates with at least one surface to be coated and reactants for forming a desired product are introduced into the reactor or deposition chamber. The one or more substrates are typically placed on a wafer support or susceptor. The wafer support is located inside a chamber defined within the reactor. The wafer is heated to a desired temperature above the condensation temperatures of the reactant gases and below the thermal decomposition temperatures of the reactant gases.

A characteristic feature of ALD is that each reactant is delivered to the substrate in a pulse until a saturated surface condition is reached. As noted above, one reactant typically adsorbs on the substrate surface and a second reactant subsequently reacts with the adsorbed species. As the growth rate is self-limiting, the rate of growth is proportional to the repetition rate of the reaction sequences, rather than to the temperature or flux of reactant as in CVD.

To obtain self-limiting growth, vapor phase reactants are kept separated by purge or other removal steps between sequential reactant pulses. Since growth of the desired material does not occur during the purge step, it can be advantageous to limit the duration of the purge step. A shorter duration purge step can increase the available time for adsorption and reaction of the reactants within the reactor, but because the reactants are often mutually reactive, mixing of the vapor phase reactants should be avoided to reduce the risk of CVD reactions destroying the self-limiting nature of the deposition. Even mixing on shared lines immediately upstream or downstream of the reaction chamber can contaminate the process through parasitic CVD and subsequent particulate generation.

SUMMARY OF THE INVENTION

To prevent the vapor phase reactants from mixing, ALD reactors may include an "inert gas valving" or a "diffusion barrier" arrangement in a portion of a supply conduit to prevent flow of reactant from a reactant source to the reaction chamber during the purge step. Inert gas valving involves forming a gas phase, convective barrier of a gas flowing in the opposite direction to the normal reactant flow in the supply conduit. See T. Suntola, *Handbook of Crystal Growth III, Thin Films and Epitaxy, Part B: Growth Mechanisms and Dynamics*, ch. 14, *Atomic Layer Epitaxy*, edited by D. T. J. Hurle, Elsevier Science V. B. (1994), pp. 601–663, the disclosure of which is incorporated herein by reference. See especially, pp. 624–626. Although such prior art arrangements have been successful in preventing vapor phase reactants from mixing, these techniques do have certain disadvantages. For example, in certain prior art arrangements the inert gas valving is formed a considerable distance upstream of the reaction chamber. Such arrangements may lengthen the time required to "shut off" the flow of reactants into the reaction space, resulting in longer pulsing steps due to downstream surface outgassing.

Accordingly, one embodiment of the present invention involves a reactor comprising a reaction chamber in which a substrate is positioned. The reactor includes a first sub-chamber, a first flow restriction located on one side of the substrate between the first sub-chamber and the reaction chamber, a second sub-chamber, a second flow restriction located on a second side of the substrate generally opposite the first side and between the second sub-chamber and the reaction chamber. A first reactant inlet and a first exhaust outlet communicate with the first sub-chamber. A second reactant inlet and a second exhaust outlet communication with the second sub-chamber. In one embodiment, the first exhaust outlet is connected to a first exhaust conduit and the second exhaust outlet is connected to a second exhaust conduit. A flow control system is provided for alternately biasing flow from the reaction chamber to either the first exhaust conduit or the second exhaust conduit.

Another embodiment of the invention comprises a method for growing thin films onto a surface of a substrate by exposing the substrate to alternatively repeated surface reactions of vapor-phase reactants. The method comprises the steps of providing a reactor having a reaction chamber, a first inlet, a second inlet, a first exhaust outlet and a second exhaust outlet. The first inlet, the second inlet, the first exhaust outlet and the second exhaust outlet are generally arranged such that the flow from the first inlet to the second exhaust outlet flows over the substrate while flow from the second inlet to the first exhaust outlet also flows over the substrate. Correspondingly, flow from the first inlet to the first exhaust outlet and flow the second inlet to the second exhaust outlet bypasses the substrate. During a first reaction process, (i) a first reactant stream is fed through the reaction chamber via the first inlet, (ii) a fraction of the first reactant stream is allowed to by pass the reaction chamber by exiting via the first exhaust outlet which is in a constricted state, (iii)

an inactive gas is fed into the second exhaust outlet through the second inlet, (iii) the first reactant stream is allowed to react with the surface of the substrate in the reaction chamber, and (iv) the first reactant stream is withdrawn from the reaction chamber through the first exhaust outlet which is in an un-constricted state. The reaction chamber is purged by placing the second exhaust outlet in an un-constricted state while the first exhaust outlet is positioned in constricted state and feeding inactive gas into the reaction chamber via the second inlet while inactive gas is fed into the first exhaust outlet through the first inlet. During a second reactant pulse, a second reactant is fed through the reaction chamber via the second inlet and open first exhaust outlet and the second reactant allowed to react with the surface of the substrate in the reaction chamber. The second reactant is withdrawn from the reaction chamber through the second exhaust outlet by feeding inactive gas into the reaction chamber via the first inlet while inactive gas is fed into the second exhaust outlet through the second inlet, and withdrawing the inactive gas from the reaction chamber through the second exhaust outlet.

In one embodiment, during the feeding of the first reactant into the reaction chamber comprises feeding less than about 50% of the first reactant flow into the first exhaust outlet. In other embodiments, from about 1% to about 40% of the first reactant flow is fed into the first exhaust outlet. In other embodiments, about 10% to about 25% of the first reactant is fed into the first exhaust outlet.

Another embodiment of the invention comprises a reactor that defines a reaction chamber for processing a substrate. The reactor comprises a first inlet for providing a first reactant and to the reaction chamber, a second inlet for a second reactant to the reaction chamber, a first exhaust outlet for removing gases from the reaction chamber; and a second exhaust outlet for removing gases from the reaction chamber. A flow control device is configured to alternately constrict flow through the first and second exhaust outlets. The reactor is configured such that when the first exhaust outlet is in an un-constricted condition and the second exhaust outlet is in a constricted condition, flow from the second inlet is directed through the reaction chamber, over the substrate to the first exhaust outlet and forms a diffusion barrier between the first inlet and the substrate.

Another embodiment of the invention comprises a method for growing thin films onto a surface of a substrate by exposing the substrate to alternately repeated surface reactions of vapor-phase reactants. The method comprises providing a reactor having a reaction chamber, a first inlet, a second inlet, a first exhaust outlet and a second exhaust outlet. During a first reactant pulse a first reactant stream is fed through the reaction chamber via the first inlet while a fraction of the first reactant stream is allowed to by-pass a substrate in the reaction chamber by exiting via the first exhaust outlet. An inactive gas is fed into the second exhaust outlet through the second inlet. The first reactant stream is withdrawn from the reaction chamber through the second exhaust outlet. During a removal process inactive gas is fed into the reaction chamber via the second inlet while inactive gas is fed into the first exhaust outlet through the first inlet. The inactive gas is withdrawn from the reaction chamber via the first outlet to form a diffusion barrier between the first inlet and the substrate positioned within the reaction chamber.

These and other objects, together with the advantages thereof over known processes and apparatuses which shall become apparent from the following specification, are accomplished by the invention as hereinafter described and claimed.

DETAILED DESCRIPTION OF THE PREFERRED EMBODIMENTS

Figure 1:
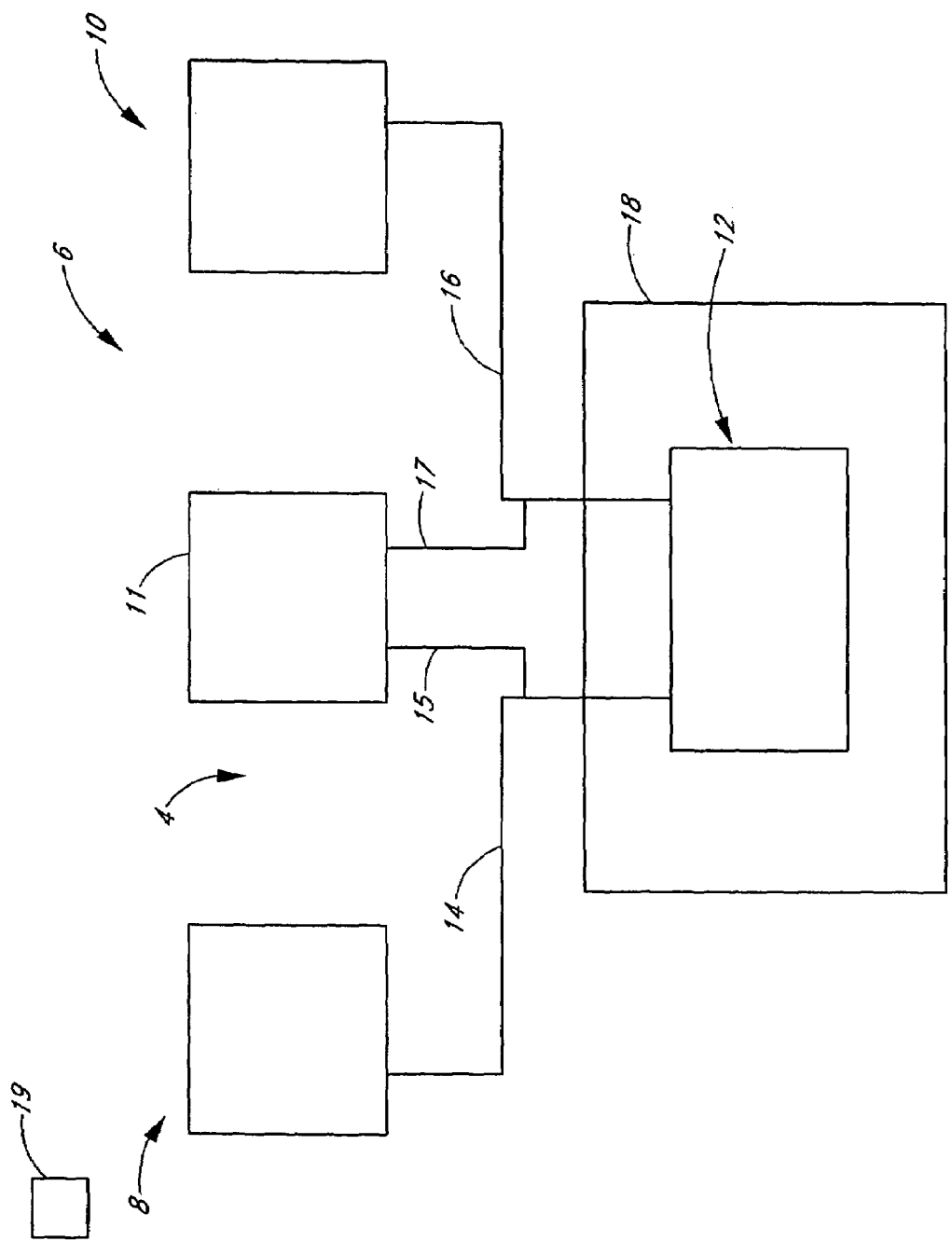
FIG. 1 is a schematic illustration of an exemplary embodiment of a reactant source assembly and a reaction chamber assembly.

FIG. 1 is a schematic illustration of an exemplary embodiment of a processing system 6 comprising a vapor supply system 4 and vapor phase reactor 12. The vapor supply system 4 is configured to selectively supply one or more vapor phase reactants and a purging gas (e.g., an inactive or inert gas) to the reactor 12. In the illustrated embodiment, the vapor supply system 4 comprises a first source apparatus 8 and a second source apparatus 10 for selectively feeding a first and a second vapor phase reactant into the reactor 12. In one embodiment, the reactant (not shown) may be liquid or solid under standard (i.e., room temperature and atmospheric pressure) conditions. Such a reactant may be vaporized within a reactant source vacuum vessel, which may be maintained at or above a vaporizing temperature within a reactant source chamber. In such embodiments, the vaporized reactant may be transported with a carrier gas (e.g., an inactive or inert gas) and then fed into the reactor 12 through first and second conduits 14, 16. In other embodiments, the reactant may be a vapor under standard conditions. In such embodiments, the reactant does not need to be vaporized and may not require a carrier gas. For example, in one embodiment the vapor phase reactant may be stored in a gas cylinder.

The vapor supply system 4 also includes a purge gas source 11 for supplying a purging gas (e.g., an inactive or inert gas) to the reactor 12. In the illustrated embodiment, purge gas source 11 is connected to the reactor 12 through first and second purge conduits 15, 17, which are respectively connected to the first and second conduits 14, 16.

It should be appreciated that the illustrated vapor supply system 4 is merely an exemplary embodiment of a vapor supply system configured to deliver vapor phase reactants and a purging gas to the reactor 12. Those of skill in the art will recognize that there are many various arrangements of valves, conduits, reactant sources, purge gas sources and/or carrier gas sources that may be used to accomplished the goal of selectively feeding a purge gas and a vapor phase reactant into the reactor 12. These arrangements may involve positioning an inert gas valving or diffusion barrier arrangement within the reactant source apparatuses 8, 10 and/or along the conduits 14, 16 (e.g., within or near the reactor vacuum chamber 18, described below). In combination or in the alternative, isolations valves may be provided the reactant source apparatuses 8, 10 or along the conduits 14, 16 for selectively directing a purge gas and/or vapor phase reactants to the reactor 12.

It should also be appreciated that the illustrated vapor supply system 4 of FIG. 1 is a schematic illustration. Accordingly, many components of the supply system 4 have been omitted for simplicity. Those of skill in the art will recognize that the supply system 4 will include various valves, purifiers, heaters, containers, and/or bypasses that are not illustrated.

The exemplary processing system 6 is particularly suited for delivering vapor phase reactants to be used in a vapor phase reactor. In one preferred embodiment, the vapor phase reactants are used for deposition (e.g., CVD) and more preferably for Atomic Layer Deposition, ALD, (formerly known as Atomic Layer Epitaxy, abbreviated ALE). As mentioned above, in ALD, vapor phase reactants are fed into the reactor 12 in the form of alternate vapor phase pulses that are preferably separated by removal steps (e.g., purging, pumping down and/or a combination thereof). ALD is typically characterized by self-saturating, adsorption reactions that take place within a temperature window that lies above the condensation temperature of the vapor phase reactants and below a thermal decomposition limit of the reactants. Typically, less than or about one molecular monolayer of reactant is deposited per cycle. In ALD, it is generally advantageous to keep reactants separated from each other until they are allowed to react on the surfaces of the reactor and gas delivery system. Mixing of the vapor phase reactants in the processing system upstream of the reaction surface may cause undesirable deposition and vapor-phase reactions.

A control system 19 is configured to control the processing system 6. For example, the control system can include control software and electrically or pneumatically controlled valves to control the flow of reactant and purge gases into and out of the reactor 12. In one embodiment that is particularly suited for ALD reactors, the control system 19 also controls the flow of the treatment gas into the reactor 12 to deactivate the surface against ALD reactions, such as by forming a protective layer on an inner surface of the reaction space. After deactivating the surfaces, the control system loads substrate(s) into the chamber 12 and flows reactant and/or purge gases into the chamber 12 to form a deposit on the substrate (e.g., silicon wafer). The control system can include modules such as a software or hardware component, e.g., a FPGA or ASIC, which performs certain tasks. A module can advantageously be configured to reside on the addressable storage medium of the control system and be configured to execute one or more processes.

In the exemplary embodiment, the reactor 12 is located within a reactor vacuum chamber 18. In one embodiment, the reactor vacuum chamber 18 can be individually evacuated and/or thermally controlled. In a similar manner, the reactant source vessels (not shown) may be positioned within a source vacuum chamber that may also be individually evacuated and/or thermally controlled. As is known in the art, various radiant heaters may be positioned within the vacuum chambers to heat the reactor and/or source vessel. The vacuum advantageously thermally isolates the components within the vacuum chambers.

Figure 2:
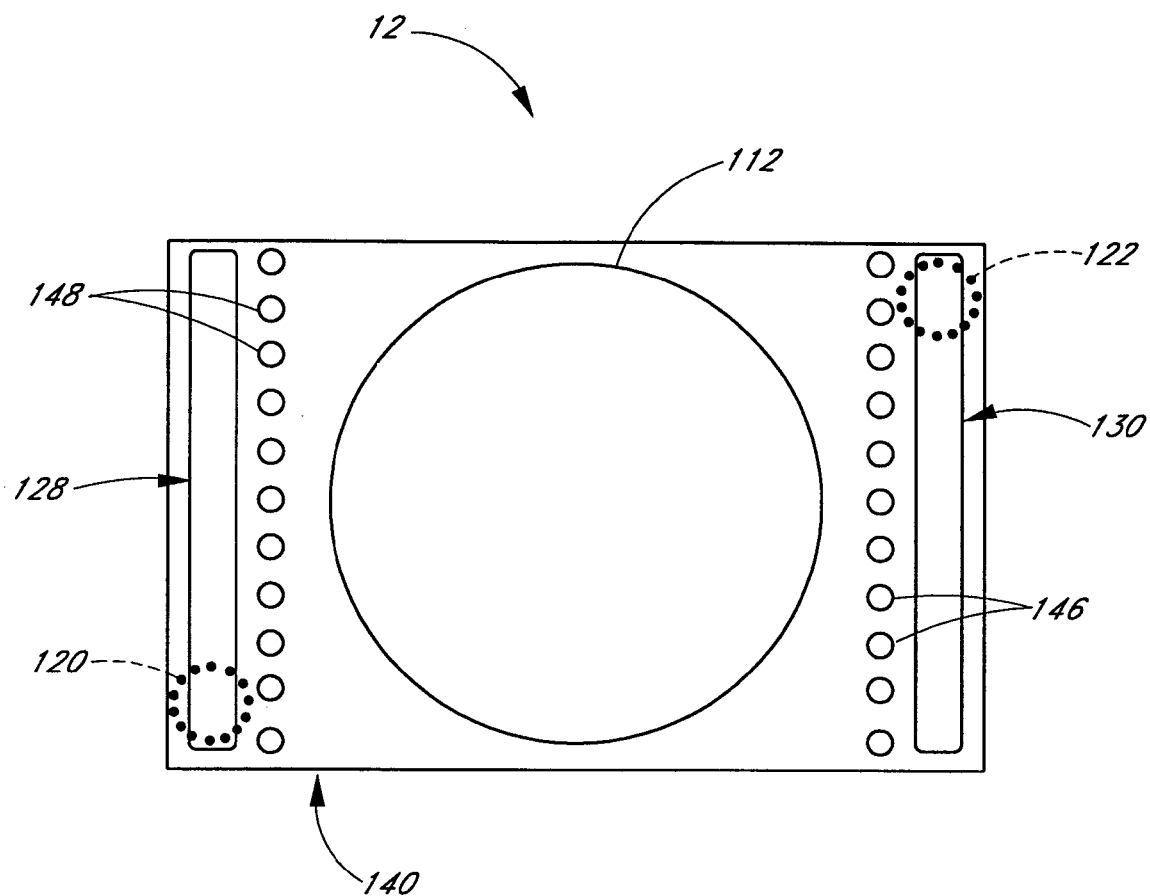
FIG. 2 is a schematic top view of the lower portion of an exemplary embodiment of a reactor.
Figure 3:
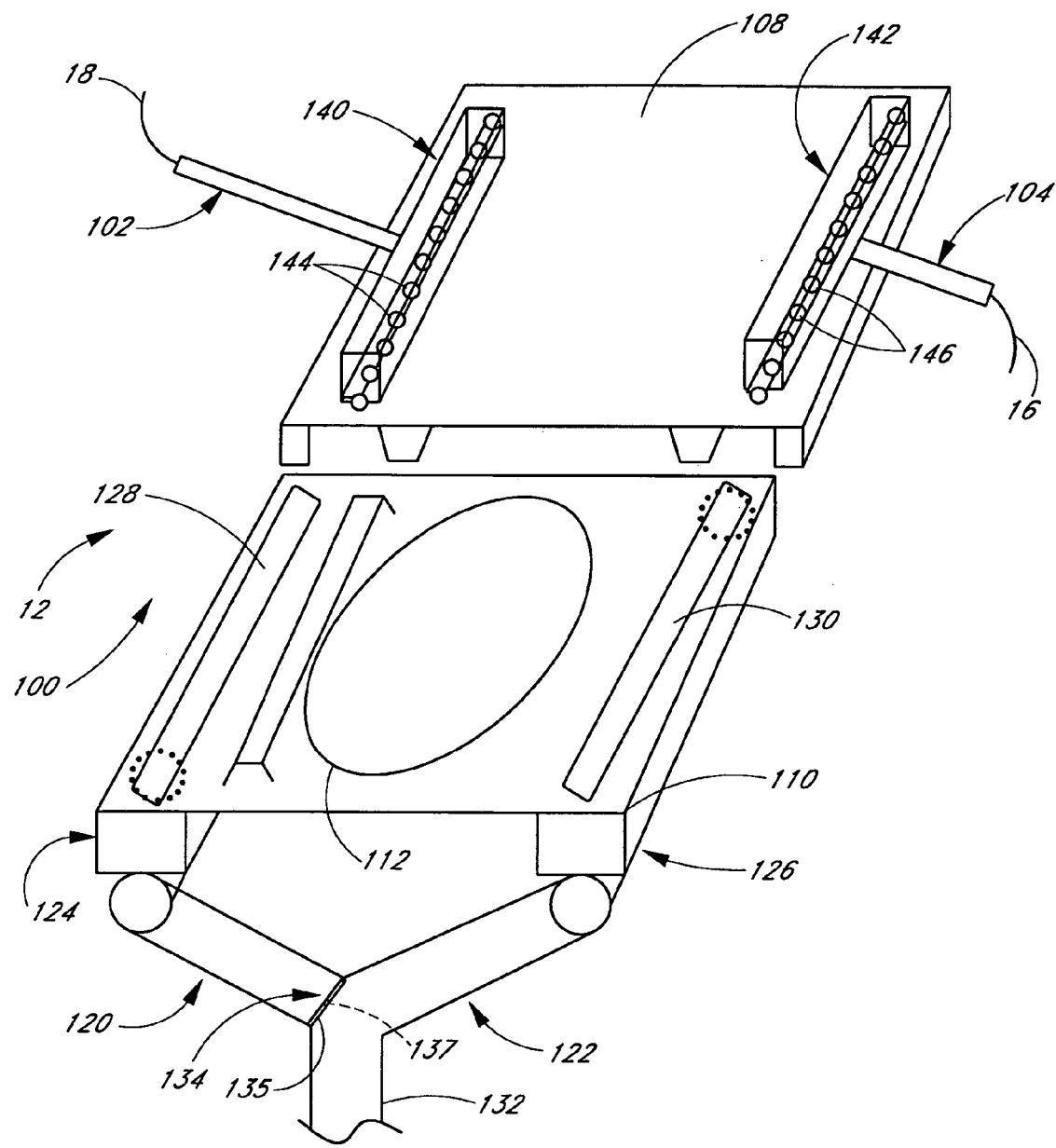
FIG. 3 is a side perspective view of the reactor of FIG. 2.
Figure 4:
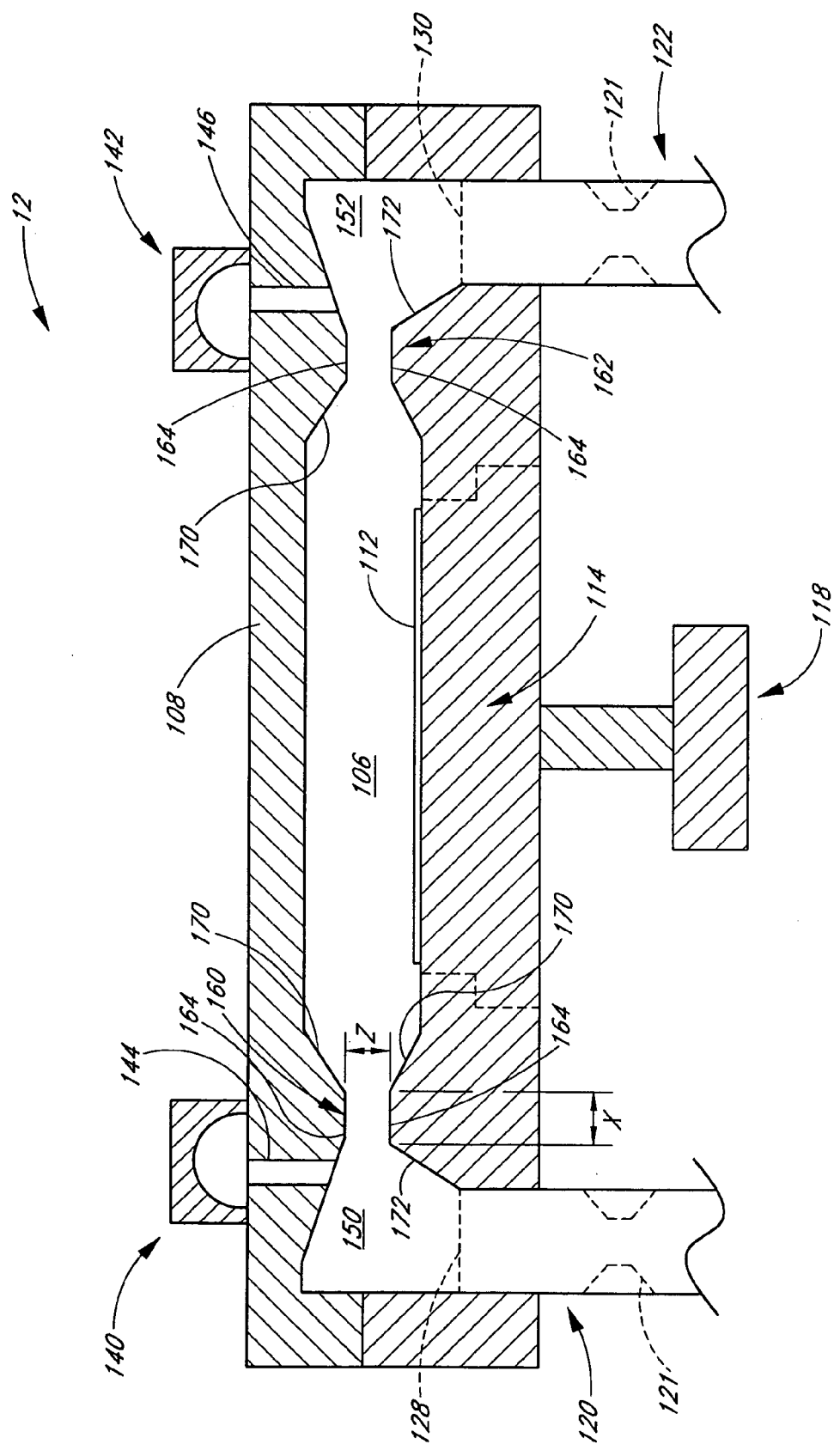
FIG. 4 is a cross-sectional side view of the reactor of FIG. 2.

FIGS. 2–4 illustrate the exemplary embodiment of the reactor 12. As will be explained in more detail below, a diffusion barrier is formed, at least partially, within the reactor 12 to separate the reactant gases. As mentioned above, the reactor 12 selectively receives a purging gas and vapor phase reactants from the first and second conduits 14, 16. In one embodiment, the purging gas and vapor phase reactants are selectively delivered to the reactor 12 through an inert gas valving system positioned within the reactant source apparatuses 8, 12 and/or along the conduits 14, 16. In other embodiments, the purging gas and/or vapor phase reactants are selectively delivered to the reactor 12 by providing, for example, isolation valves very close to the reactor 12.

The exemplary reactor 12 is positioned within the reactor chamber 18 (see FIG. 1). The first conduit 14 forms a first inlet line 102 for supplying a first reactant to the reactor 12. The second conduit 16 forms a second inlet line 104 for supplying a second reactant to the reactor 12. In modified embodiments, the reactor 12 may be provided with more than two inlet lines for supplying more than two reactants to the reactor and/or additional conduits and/or injection manifolds may be provided for supplying more than one reactant to the inlet lines 102, 104. In such embodiments, the processing system 6 (see FIG. 1) may be provided with additional reactant source apparatuses.

As seen in FIG. 4, a reaction chamber 106 is formed between a top plate 108 and a base plate 110, which may be suitably coupled to each other or integrally formed. Of course, in modified embodiments, the reaction chamber 106 may be formed from more than two plates. A substrate 112 is positioned within the reaction chamber 106. The substrate 112 is positioned on a susceptor plate 114, which may be coupled to an actuator 118 such that the susceptor plate 114 is moveable with respect to the base plate 110. In the illustrated embodiment, the susceptor plate 114 is moveable in a vertical direction to facilitate moving the substrate 112 in and out of the reaction chamber 106. Of course, in modified embodiments, the susceptor plate 114 may be stationary and other parts of the reactor may be moveable to provide access to the reaction chamber 106.

The top, base and susceptor plates 108, 110, 114 may each be provided with a variety of different heater elements (not shown) to heat the substrate 112 and/or the reaction chamber 106. The heating of the reaction chamber 106 and/or substrate 112 may be augmented by providing reflective shields (not shown) and/or additional heater elements (not shown) about the reactor 12 within the reaction vessel 18 (see FIG. 1). See e.g., U.S. Pat. No. 6,579,374 issued Jun. 17, 2003, which discloses a modified reactor design which may be used in combination with the teachings of this application and which is hereby incorporated by reference herein.

With particular reference to FIGS. 2 and 4, the reactor 12 is provided with a first exhaust duct 120 and a second exhaust duct 122. Each exhaust duct 120, 122 is in communication with the reaction chamber 106 through an exhaust manifold 124, 126. The exhaust manifolds 124, 126 terminate in first and second exhaust outlets 128, 130. The first outlet 128 is positioned on a first side of the substrate 112 and/or the susceptor 114 and the second exhaust outlet 130 is positioned on a second side of the substrate 112 and/or the susceptor 114. In one embodiment, the first and second sides represent near and far sides of the substrate 112 and/or the susceptor 114 and in another embodiment the first and second sides are substantially opposite each other with respect to the substrate 112 and/or the susceptor 114 In other embodiments, the first and second sides may be positioned between an angle of about 45 degrees to 135 degrees with respect to each other. In addition, as will be explained in more detail below, in certain embodiments more than two exhaust outlets 130 may be positioned on more than two sides of the substrate 112 and/or the susceptor 114.

Each exhaust outlet preferably extends substantially across the reaction chamber 106. That is, the first and second outlets 128, 130 preferably extend from a first point and a second point, which are separated by a distance that is at least as great as 50% of the width of the substrate 112 and often by a distance as great as about the width of the substrate 112. In the illustrated arrangements, the first and second outlets 128, 130 are each formed from a single opening; however, in modified embodiments they may be each subdivided into a plurality of openings.

In the illustrated embodiment, the exhaust ducts 120, 122 preferably merge into a common exhaust duct 132 at some point downstream of the reactor 12. See FIG. 3. A flow diverting device 134 may be provided at the junction between the exhaust ducts 120, 122 to alternately constrict the flow through the exhaust ducts 120, 122 into the common exhaust 132. In the illustrated embodiment, the flow diverting device 134 comprises a high speed differential flapper valve 135 with a small orifice 137 embedded in the valve 135 to allow a relatively small through flow in the closed position. In another embodiment, those of skill in the art will recognize that a three way valve with one large conductance or an arrangement of two 2-way valves with restricted bypasses may be used to alternately constrict the flow through the exhaust ducts 120, 122. Of course those of skill of art will also recognize other arrangements for alternately constricting the flow through the exhaust ducts 120, 122. For example, each exhaust duct 120, 122 may be connected to a separate exhaust source and provided with a separate constriction system (e.g., a pinch valve). In such an embodiment, the constriction system may be controlled to function as the flow diverting device 134 described herein.

With reference to FIG. 4, the exhaust ducts 120, 122 may include restrictions 121 (see dashed lines). The restrictions 121 accelerate the flow of gas through the exhaust ducts 120, 122. By increasing the velocity through the exhaust ducts 120, 122, the effectiveness of the diffusion barriers formed in the exhaust ducts 120, 121 are enhanced. The restrictions 121 may also allow less gas to be lost through the exhaust ducts 120, 122 during certain processing steps. In addition, the restrictions 121 may also offer increased conductance of the exhaust duct 120, 122 compared to an exhaust duct of smaller diameter without the restriction 121. This reduces the pump size necessary to achieve a desired reactor pressure.

With continued reference to FIGS. 2 to 4, the first inlet 102 is connected to a first inlet manifold 140 and the second inlet 104 is connected to a second inlet manifold 142. The inlet manifolds 140, 142 direct gases to a discharge openings 144, 146, which in the illustrated embodiment each comprise a plurality of discrete discharge orifices which may be formed in the top plate 108 or by perforated gaskets sandwiched between the manifolds 140, 142 and the top plate 108. In other embodiments, the discharge openings may be formed by one or more slit-type orifices. The discharge openings 144, 146 respectively communicate with a first and second sub-chambers 150, 152 (FIG. 4), which are defined in the reactor 12 between the top and base plates 108, 110. The first and second outlets 128, 130 of the exhaust manifolds 124, 126 are preferably also in communication with the first and second sub-chambers 150, 152.

As with the outlets 128, 130, the first discharge opening 146 is generally positioned on a first side of the substrate 112 and/or susceptor 114 and the second discharge opening 148 is positioned on a second side of the substrate 112 and/or susceptor 114. In one embodiment, the first and second sides represent near and far sides of the substrate 112 and/or susceptor 114 and in another embodiment the first and second sides are substantially opposite each other with respect to the substrate 112 and/or susceptor 114. In other embodiments, the first and second sides may be positioned between an angle of about 45 degrees to 135 degrees with respect to each other. In addition, as will be explained in more detail below in certain embodiments more than two discharge openings 146, 148 may be positioned on more than two sides of the substrate 112 and/or susceptor 114.

Each discharge opening 144, 146 is preferably configured to spread the gas flow from the inlets 102, 104 across the width of the substrate 112. As such in the illustrated embodiment, the discharge openings 144, 146 a distributed across a width that is approximately as wide or wider than about 50% width of the substrate 112 and often as wide or wider than the width of the substrate. That is, the distance between the outer most discharge openings 144, 146 are each set is preferably approximately as large or larger than about 50% the width of the substrate 112 and often larger than about the width of the substrate, or in the case of a single discharge opening the length of the opening is wider than about 50% the width of the substrate 112 and often wider than the width of the substrate 112. The exhaust outlets 128, 130 also preferably have a width that is approximately equal to or greater than the width of the substrates. As will be explained in more detail below, in certain circumstances this arrangement facilitates a situation where at least portions of gases flowing through a discharge opening may directly enter the corresponding exhaust outlet without entering the reaction chamber 106. In addition, the flow in the reaction chamber 106 tends to have a generally uniform velocity distribution over its width. However, it should be appreciated that in modified embodiments the shape and orientation of the discharge openings 144, 146 may be manipulated to achieve non-uniform velocity profiles which can be used to tune the reaction process.

With reference to FIG. 4, the exemplary reactor 12 preferably includes a first restriction 160 between the first sub-chamber 150 and the reaction chamber 106 and a second constriction 162 between the second sub-chamber 152 and the reaction chamber 106. The cross-sectional area of the flow restrictions 160, 162 is less than or equal to the corresponding cross-sectional area of the reaction chamber 106 for a given length X. As such, as reactant flows from one discharge opening to the opposite exhaust outlet, it preferably flows through a flow restriction.

In the exemplary embodiment, the flow restrictions 160, 162 are formed by a pair of protrusions 164 that extends towards each other from a top surface and a lower surface of the reaction chamber 106. Of course, the flow restrictions 160, 162 could be formed in a variety of other manners to reduce the cross-sectional area over a given length X (e.g., an arrangement of vertical tubule bundles).

A diffusion barrier is preferably formed, at least partially, within the flow restrictions 160, 162. As will be explained in more detail below, during operation of the reactor, a convective barrier of a gas flowing in the opposite direction with respect to the direction of flow from the openings 144, 146 to the reaction chamber 106 prevents or reduces contamination into the reaction chamber 106. In general, the operation of the diffusion barrier is a function of its length (X-direction), its cross-sectional area (e.g., height Z times width W in the illustrated embodiment) and the flow rate through the diffusion barrier. The longer the diffusion barrier is, the further the contaminant molecules have to travel to reach the region that is being protected (e.g., the reaction chamber 106). However, in general, increasing the length (X-direction) of the diffusion barrier disadvantageously increases the time of the chemical pulse and purging steps and increases the surfaces available for outgassing when the flow is reversed as described below. By reducing the cross-sectional area, for a given flow rate, the flow restrictions 160, 162 increase the gas velocity in the diffusion barrier allowing the length (X-direction) to be minimized.

More specifically, the cross-sectional area defines, in part, the facial velocity and Reynold's number of the gas in the diffusion barrier. In general, increasing the facial velocity and the Reynold's number increases the effectiveness of the diffusion barrier. For example, the cross-sectional area is determined by its characteristic dimension, which in the illustrated embodiment is the height Z of the flow restrictions 160, 162. Accordingly, in the illustrated embodiment, reducing the height Z of the flow restrictions 160, 162, increases the gas velocity in the flow restrictions and thins the boundary layer. The higher velocities dilute impurities thereby lowering concentration gradient which drives diffusion and improves convective transport of impurity molecules away from reaction chamber 106. Thinning the boundary layer improves the effectiveness of the diffusion barrier because the boundary layer represents an area of reduced velocity compared to free-stream in which molecules can easily back-diffuse.

The Reynold's number of the flow restriction is also a function of the surface roughness of the protrusions 164 which form the restriction 160, 162 and the material, pressure and temperature of the gases flowing through the restriction 160, 162. Roughening the surface of the protrusions 164 may thin the boundary layer by creating turbulence and thereby increase the distance that molecules have to travel along the surface. The velocity and Reynold's number in the flow restrictions 160, 162 may also be increased by increasing the flow rate through the reaction chamber 106. In one embodiment, the flow restrictions 160, 162 have a height from about 2 millimeters to about 15 millimeter, a width from about 10 millimeters to about 150 millimeters, and a length from about 6 millimeters to about 150 millimeters. The restriction is preferably wider than the diameter of the substrate or wafer positioned in the reactor 12. However, in modified embodiments, the restrictions 160, 162 may be narrower than the substrate or wafer. In such embodiments, an expansion region is preferably provided to spread the reactant or purging gas across the substrate or wafer. In these embodiments, the reduced width of the restrictions 160, 162 may result in higher velocities within the restrictions 160, 162. As explained above, this may allow the length or height of the restriction to correspondingly increased.

In one particular embodiment, the width (or the projected arc length if the flow restrictions 160, 162 are curved as described below) is about 350 millimeters, the height between the protrusions is about 3 millimeters and the length of the protrusion is about 10 millimeters. The height of the reaction chamber 106 above the substrate 112 may be from about 4 millimeters to about 50 millimeters and in one embodiment is about 6 millimeters. In one embodiment, the flow restriction may be positioned approximately 10–150 millimeters from the edge of the substrate.

It should be appreciated that the physical properties of the restrictions 160, 162 described above represent only some optimized arrangements. Due to the interplay of the flow rate, the relative restrictions of the exhaust outlets, the gas composition, the restriction height, width, length, and surface roughness, and possibly other physical characteristics of the reactor, the characteristics of the diffusion barrier formed within the restrictions 160, 162 cannot be described in terms of a specific set of variables. To the contrary, changes in any one variable may be offsetable by commensurate changes in another variable, to produce an effective diffusion barrier. Such optimization can be accomplished through routine experimentation by those of skill in the art in view of the disclosure herein, and in view of the objective of providing an effective diffusion barrier as taught herein. In addition, the physical properties of the restrictions 160, 162 are dependent on the acceptable concentration of contaminant in the reactor. The acceptable concentrations of contaminant will change based on the chemistry involved in the reactor 12.

Those of skill in the art will also recognize in light of the disclosure herein that it is generally desirable to minimize the volume of the reaction chamber 106 such that gas direction in the reactor can be rapidly changed by opening and closing of exhaust valve 134. The volume of exhaust lines 120, 122 are also preferably minimized to lessen the gas direction switching time in the reactor 12.

The sub-chambers 150, 152 advantageously facilitate forming the inlet and outlets 144, 146, 128, 130. The desired volume of the sub-chambers 150, 152 is generally a function of the gas flow rate through the reactor 12, the pressure differential between the sub-chambers 150, 152, temperature and the allowed gas switching time. In general, reducing the volume of the sub-chambers 150, 152 reduces the gas switching time. In one exemplary embodiment, the reactor utilizes a flow rate of about 500 std cc/min of nitrogen at a reactor temperature of about 375 degrees Celsius and a pressure difference of about 2 Torr between the sub-chambers 150, 152. In such an embodiment, the sub-chambers 150, 152 may have a volume of less than about 750 cc, and sometimes less than 500 cc and often less than 250 cc.

In the illustrated embodiment, the reaction chamber 106 also includes transition surfaces 170 between the flow restrictions 160, 162 and the substrate 112. In a similar manner, the sub-chambers also include transitions surfaces 172. These transition surface allow for smooth transitions in gas contraction and expansion to avoid flow recirculation and stagnation. As such, the surfaces 170, 172 are generally tapered or sloped surfaces that provided for a general contraction or expansion of the cross-sectional area from the sub-chambers 150, 152 to the protrusions 164 and from the protrusions 164 to the reaction chamber 106. In the exemplary embodiment, the discharge openings 144, 146 are positioned in the transition surface 172 of the sub-chambers 150, 152 between (in a lateral direction) the exhaust outlets 128, 130 and the flow restrictions 160, 162. This arrangement advantageously reduces turbulent mixing in the exhaust outlets 128, 130 that could result if gas is injected immediately above a large volume. Such mixing could stir up particles from the exhaust and carry them into the reaction chamber 106. In addition, by positioning the discharge openings 144, 146 closer to the diffusion barrier zone 160, 162, a more a direct path is provided for the purge gas entering the reaction chamber 106 as described below. As indicated by the dashed lines of FIG. 5A, the surfaces of the sub-chambers 150, 152 may be smoothed or otherwise configured out to promote flow of the purge gas into the reaction chamber 106.

In modified embodiments, the exhaust outlets 128, 130 may be positioned in the transition zone 172 between (in a lateral direction) the discharge openings 144, 146 and the flow restrictions 160, 162. In other embodiments, the discharge openings 144, 146 and the exhaust outlets 128, 130 may be positioned generally above and below each other within the transition zones 172 or outside the transition zones 172 (i.e., the discharge openings 144, 146 and the exhaust outlets 128, 130 can be located the same lateral distance from the substrate 112).

FIGS. 5A–D illustrate an exemplary embodiment of operation that may be used with the reactor 12 described above. In the description herein and in these FIGS. 5A–5D it should be appreciated that while first reactant and second reactant will be used interchangeably with "oxidizer" and "metal" for convenience, the description herein applies to many different combinations of reactants and is not intended to be limited to processes that utilize an oxidizer pulse and/or a metal pulse.

Figure 5A:
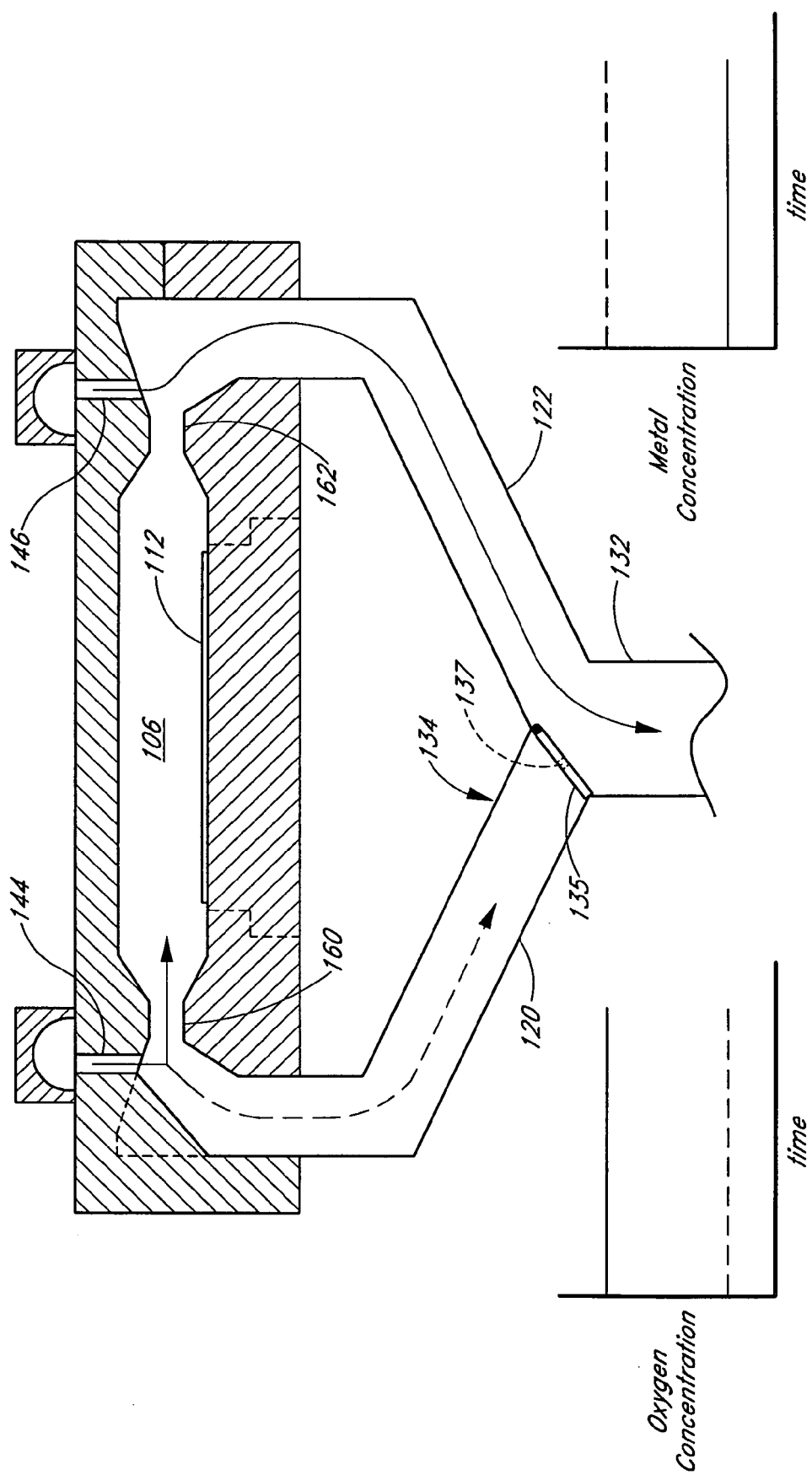
FIGS. 5A–5D are cross-sectional side views of the reactor of FIG. 2 showing the steps of one embodiment of use.

FIG. 5A illustrates a first step of such an embodiment in which a pulse of a first reactant (e.g., an oxidizer such as $H_2O$) is injected with or without a carrier gas into the reaction chamber 106 through the first discharge opening 144. The flow directing device 134 is positioned such that the exhaust flow through the reaction chamber 106 is biased though the second exhaust duct 122. In one embodiment, this involves substantially closing the first exhaust duct 120 such that only a small opening connects the first duct 120 to the common exhaust duct 132. During this step, a purge gas (e.g., $N_2$) is injected through the second discharge opening 146. As shown in FIG. 5A, because the first exhaust conduit 120 is substantially closed, most of the first reactant is directed into the reaction chamber 106 and over the substrate 112 while a small amount of the first reactant flows directly into the closer first exhaust duct 120. Conversely, most of, and preferably substantially all of, the purge gas flows from the second discharge opening 146 directly into the closer second exhaust conduit 122. The flow of purge gas through the second discharge opening 146 advantageously keeps the overall flow to the vacuum pump approximately the same, thus keeping reactor pressure approximately constant. In addition, the flow of purge gas through the second discharge opening 146, keeps the opening 146 and the sub-chamber 152 purged and forms a diffusion barrier within these components.

In one exemplary embodiment, the exhaust ducts 120, 122 and flow directing valve 134 are configured such that if approximately 800 sccm of reactant and purge gas are injected through the first and second discharge openings respectively (i) less than about 50% of the first reactant enters the first exhaust conduit 120, more preferably about 1% to about 40%, most preferably about 10% to about 25% (ii) the remaining balance of the first reactant enters the reaction chamber 106 and is exhausted through the further second exhaust conduit 122, and (iii) 800 sccm of the purge gas from the second discharge opening 146 flows directly into the closer second exhaust conduit 122.

Figure 5B:
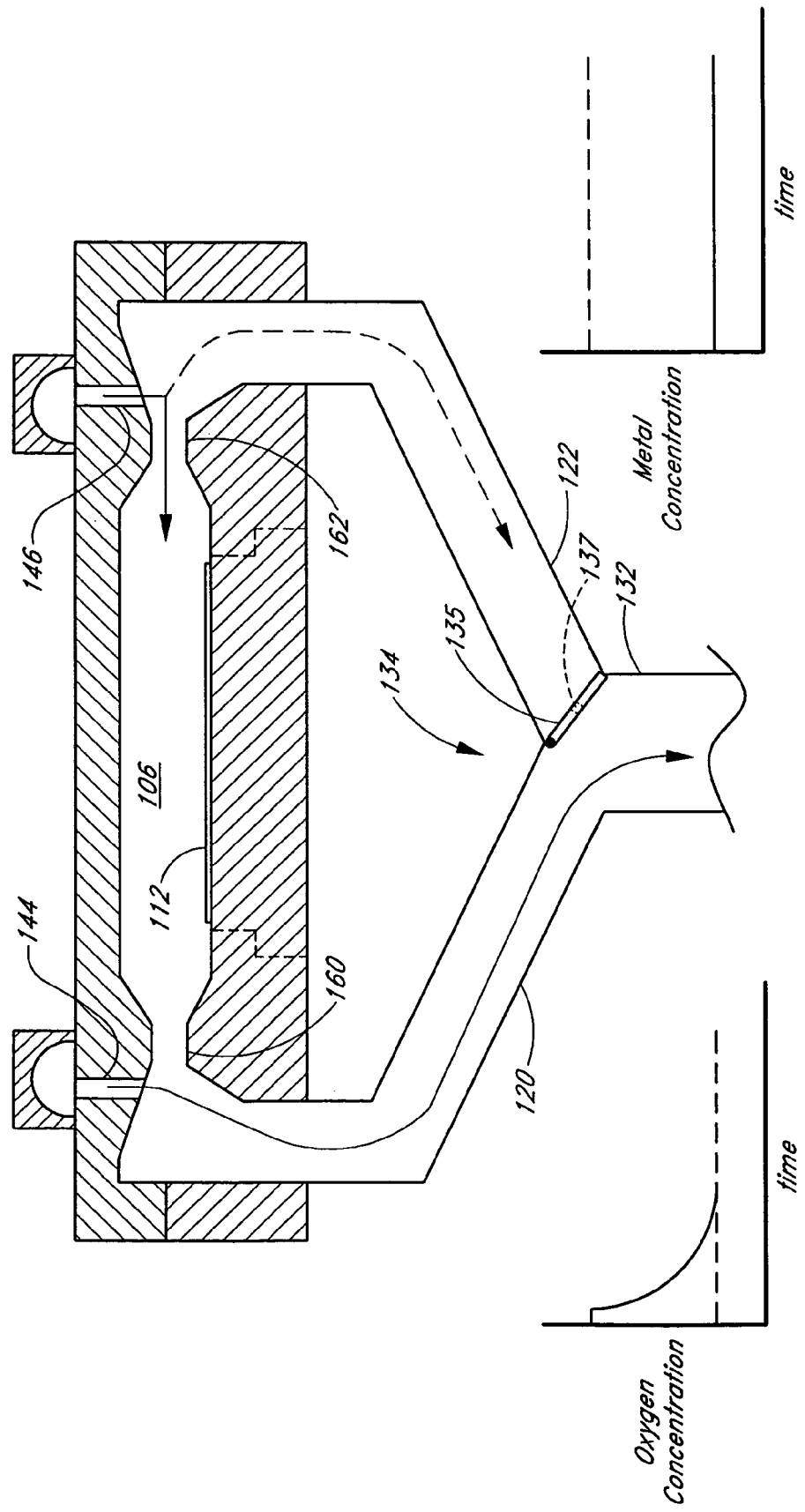

FIG. 5B illustrates a second step in which purge gas is directed through both discharge openings 144, 146. As shown, the flow directing device 134 is preferably moved such that the exhaust is biased through the first exhaust duct 120 and that there is only a small opening in the second exhaust duct 122. As mentioned above, purge gas is injected through both discharge openings 144, 146. However, because of the position of the flow directing device 134, the purge gas from the second discharge opening 146 is preferentially directed over the substrate 112. One advantage of this arrangement is that the purge gas flowing in the reaction chamber 106 and over the substrate 112 is from the far side second discharge opening 146. This purge gas tends to be more pure (i.e., less contaminated with reactant) as compared to the purge gas from the first discharge opening 144 because the second discharge opening 146 has been purging during the previous step. As indicated in FIG. 5B, a diffusion barrier is formed in the restriction 160 to prevent oxidizer back diffusion into the reactor, and contaminating the "left" edge of the wafers with CVD growth As shown in the associated graph, during this step the concentration of the oxidizer in the reactor 106 decreases as the reactor is purged.

In one exemplary embodiment, during this step, the exhaust ducts 120, 122 and flow directing valve 134 are configured such that if approximately 800 sccm purge gas is injected through each of the first and second discharge openings (i) less than about 50% of the purge gas from the second discharge openings 146 enters the second exhaust conduit 122, more preferably about 1% to about 40%, most preferably about 10% to about 25%, (ii) the remaining balance of the purge gas from the second discharge opening 146 enters the reaction chamber 106 and is exhausted through the further first exhaust conduit 120, and (iii) approximately 800 sccm of the purge gas from the first discharge opening 144 flows directly into the closer first exhaust outlet 120.

Figure 5C:
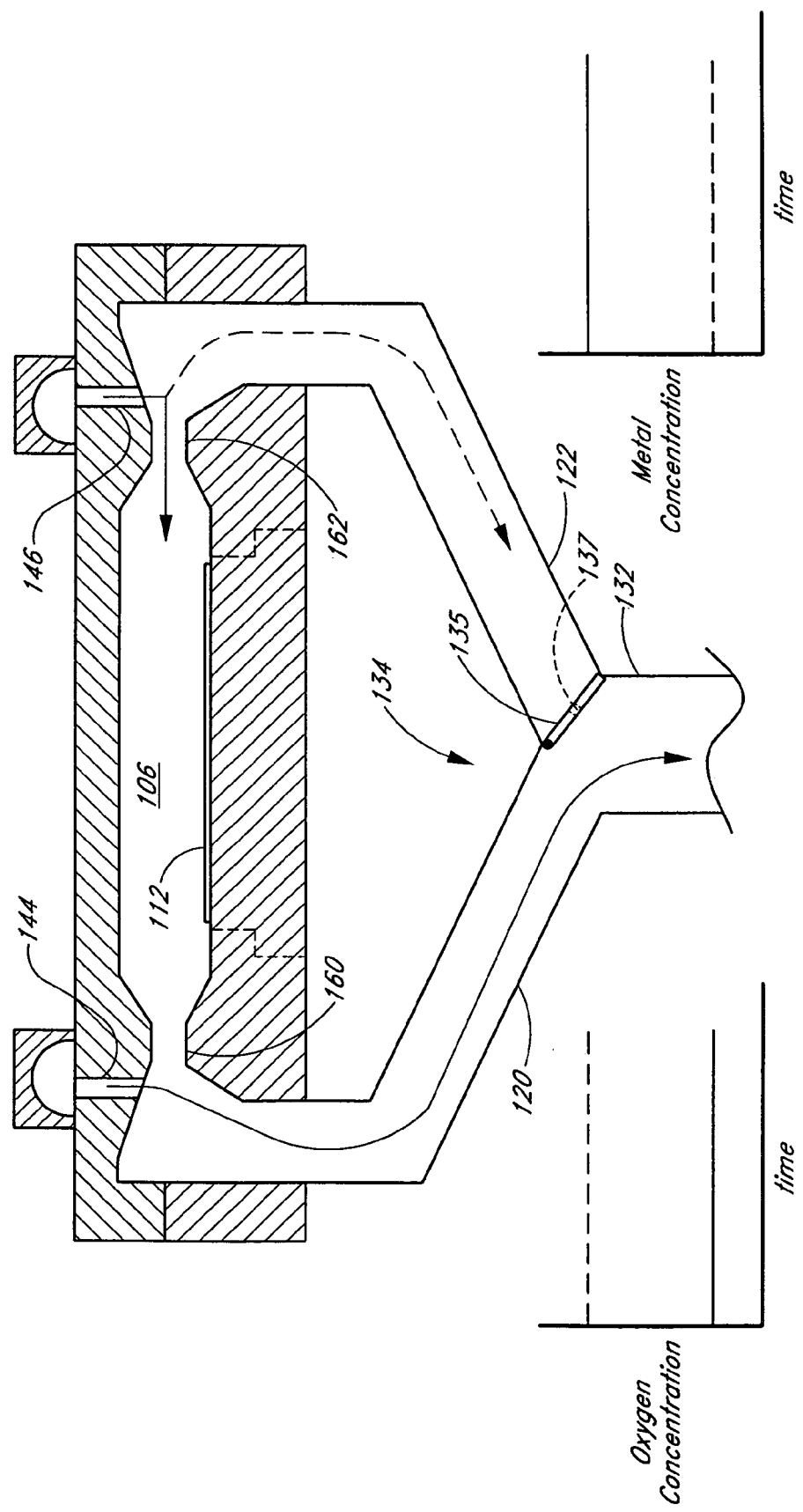

FIG. 5C illustrates a third step in which a pulse of a second reactant (e.g., a metal precursor such as $HfCl_4$) is injected into the reaction chamber 106 through the second discharge opening 146 while purge gas is injected through the first discharge opening 144. In this step, the flow directing device 134 may remain in the same or a similar position as the previous step. That is, the exhaust gases through the reaction chamber 106 are biased through the first exhaust duct 120. As shown in FIG. 5C, most of the second reactant is directed into the reaction chamber 106 while a smaller amount of the second reactant flows directly into the second exhaust conduit 122. In contrast, most and preferably substantially all of the purge gas through the first discharge opening 144 is directed into the first exhaust conduit 120. As shown in the graphs associated with FIG. 5C, during this step the concentration of the second reactant in the reaction chamber 106 is elevated while the concentration of the first reactant remains reduced. The flow of purge gas through the first discharge opening 144 advantageously keeps the overall flow to the vacuum pump approximately the same, keeping reactor pressure approximately constant. In addition, the flow of purge gas through the first discharge opening 144 also keeps the sub-chamber 152 and the associated conduits purged and forms a diffusion barrier within the discharge opening.

In the exemplary embodiment, during this step, approximately 800 sccm of purge gas is injected through the first discharge opening 144 and approximately 800 sccm of reactant is injected through the second discharge opening 146. In such an embodiment, the reactor may be configured such that (i) approximately 800 sccm of the purge gas from the first discharge opening 144 enters the closer first exhaust conduit 120 (ii) less than about 50% of the reactant from the second discharge opening 146 enters the second exhaust conduit 122, more preferably about 1% to about 40%, most preferably about 10% to about 25% and (iii) the remaining balance of the second reactant enters and crosses the reaction chamber 106 and is discharged through the further first exhaust conduit 120.

Figure 5D:
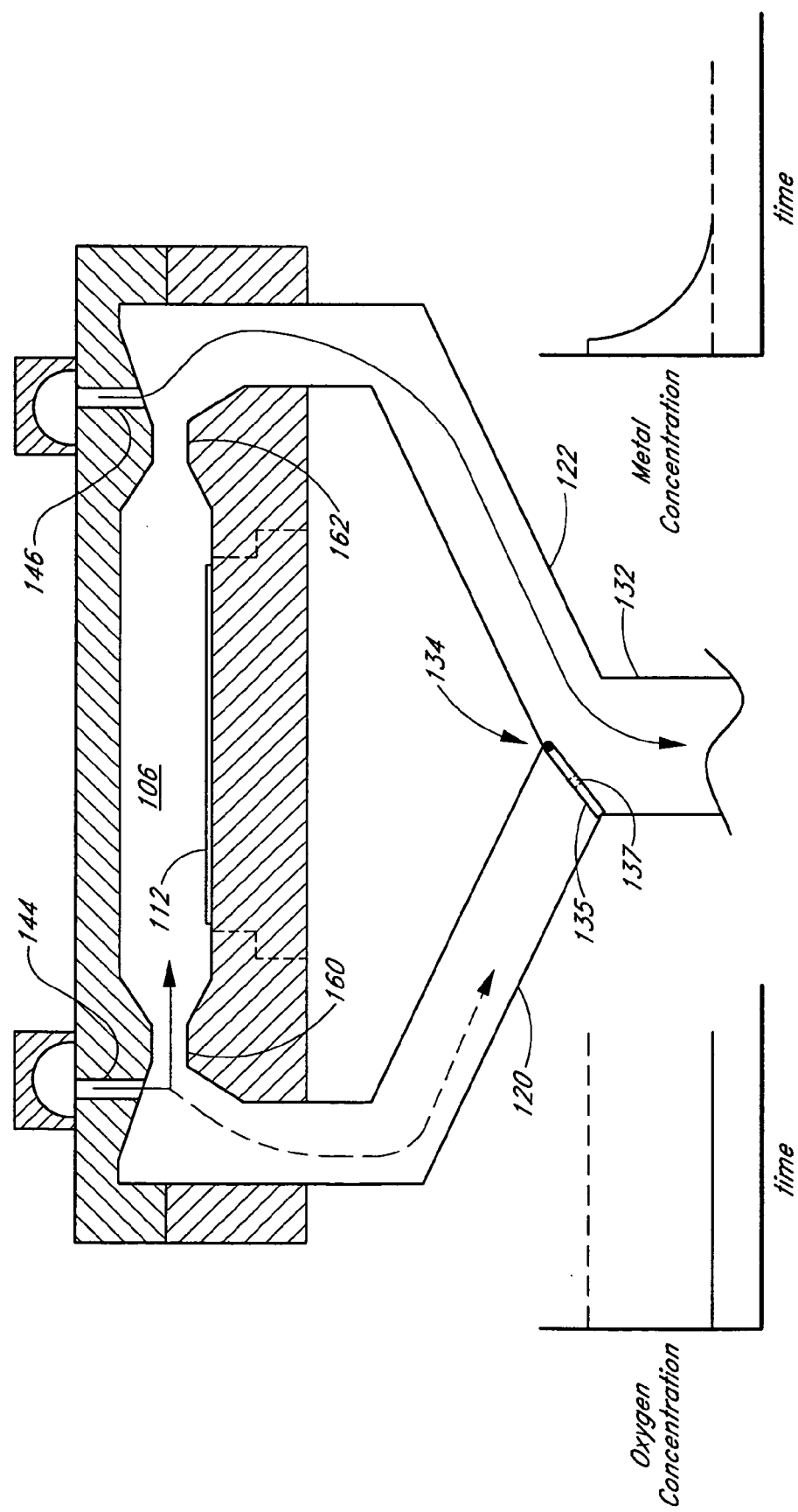

FIG. 5D illustrates a fourth step in which the reaction chamber 106 is purged with inactive gas through both discharge openings 144, 146. As shown, the flow director 134 is preferably positioned such that the exhaust gases are biased through the second exhaust conduit 122. In addition, the purge gas from the first discharge opening 144 is directed into the reaction chamber 106. One advantage of this arrangement is that the purge gas flowing in the reaction chamber 106 and over the substrate is from the first discharge opening 144, which was being purged during the previous step. Accordingly, the concentration of the first reactant entering the reaction chamber 106 is very low as indicated in the graphs associated with FIG. 5D. In addition, as indicated in FIG. 5D, a diffusion barrier is formed in the restriction 162 to prevent back diffusion from the second discharge opening 146 of the second reactant into the reactor.

In the exemplary embodiment, approximately 800 sccm of purge gas is injected through the first discharge opening 144 and approximately 800 sccm of purge gas is injected through the second discharge opening 146. In such an embodiment, the reactor may be configured such that (i) less than about 50% of the purge gas from the first discharge opening 144 enters the first exhaust conduit 120, more preferably about 1% to about 40%, most preferably about 10% to about 25%, (ii) the remaining balance of the purge gas from the first inlet opening 144 enters and crosses the reaction chamber 106 and (iii) approximately 800 sccm of the purge gas from the second discharge opening 146 enters the further second exhaust conduit 122.

The above arrangement has several advantages. For example, during a reactant pulse a diffusion barrier is positioned between the substrate 112 and the discharge opening for the opposing reactant. That is, vapors from the discharge opening of the opposing reactant must flow upstream against the flow of gas to reach the reaction chamber. Such vapors may be caused by "leaking in" through outgassing of lines upstream of the reactor 12, or leaking through precursor valves or sources or diffusion through inert gassing upstream of the reactor or simply flow or remaining reactant left in the lines after switching an upstream valve. The diffusion barrier formed at the constrictions 160, 162 within the reactor 12 suddenly cut off the flow or reactor for rapid, clean switching. In addition, the adjacent restriction preferably increases the effectiveness of the diffusion barrier by increase the gas velocity through which these contaminating vapors must travel. This arrangement advantageously reduces the likelihood that the reactants from first and second discharge openings 144, 146 will mix within the reaction chamber 106. In addition, any mixing will generally occur in the interior spaces 150, 152, which are in communication with the exhaust openings 128, 130 (see FIG. 4) and separated from the reaction chamber 106 by the flow restrictions 160, 162. As such, any reaction products formed in the sub-chambers 150, 152 (see FIG. 4) will be directed through the exhaust conduits 120, 122.

Another advantage of the embodiment described above is that, during the first and second reactant pulses, a sufficiently large fraction of the flow from discharge openings 144, 146 is still directed through the exhaust lines 120, 122. This advantageously inhibits precursor and byproduct that are outgassing from the exhaust surfaces from diffusing and being 'pumped' into the reaction chamber 106. In contrast, if a fraction of the flow is not directed to the exhaust lines 120, 122, the gas injected into the reactor may function like a Venturi and "pump" exhaust particles that may be shed from coatings on the exhaust lines 120, 122 and chemicals into reaction chamber 120, 122. This entrained contaminant would disadvantageously cause CVD growth within the reaction chamber.

As mentioned above, another advantage of the mode of operation described with respect to FIGS. 5A–5D is that the opposite discharge opening 144, 146 is used to purge the reaction chamber 106. Because the opposite discharge opening 144, 146 has been purging during the reactant pulse of the opposite opening, the purge gas has less contaminates because it has been purging longer. This advantageously reduces CVD contributions of the gas delivery system all the way up to the edge of the substrate.

Although the exemplary embodiments are described in the context of two reactants, those of skill in the art will recognize the techniques and/or apparatus described herein may be extended to more than two reactants. In addition, it should be appreciated that the processes described herein as "purging" may in modified embodiments be replaced with other types of removal processes, such as, for example, pumping down or combinations of purging and pumping down.

FIGS. 6A–6D illustrate an exemplary embodiment of operation that may be used with the reactor 12 described above. As will be explained below, this embodiment is similar to the embodiment of use described above. However, in this embodiment, the reactor chamber 106 may be purged from the same side as the previous chemical pulse.

Figure 6A:
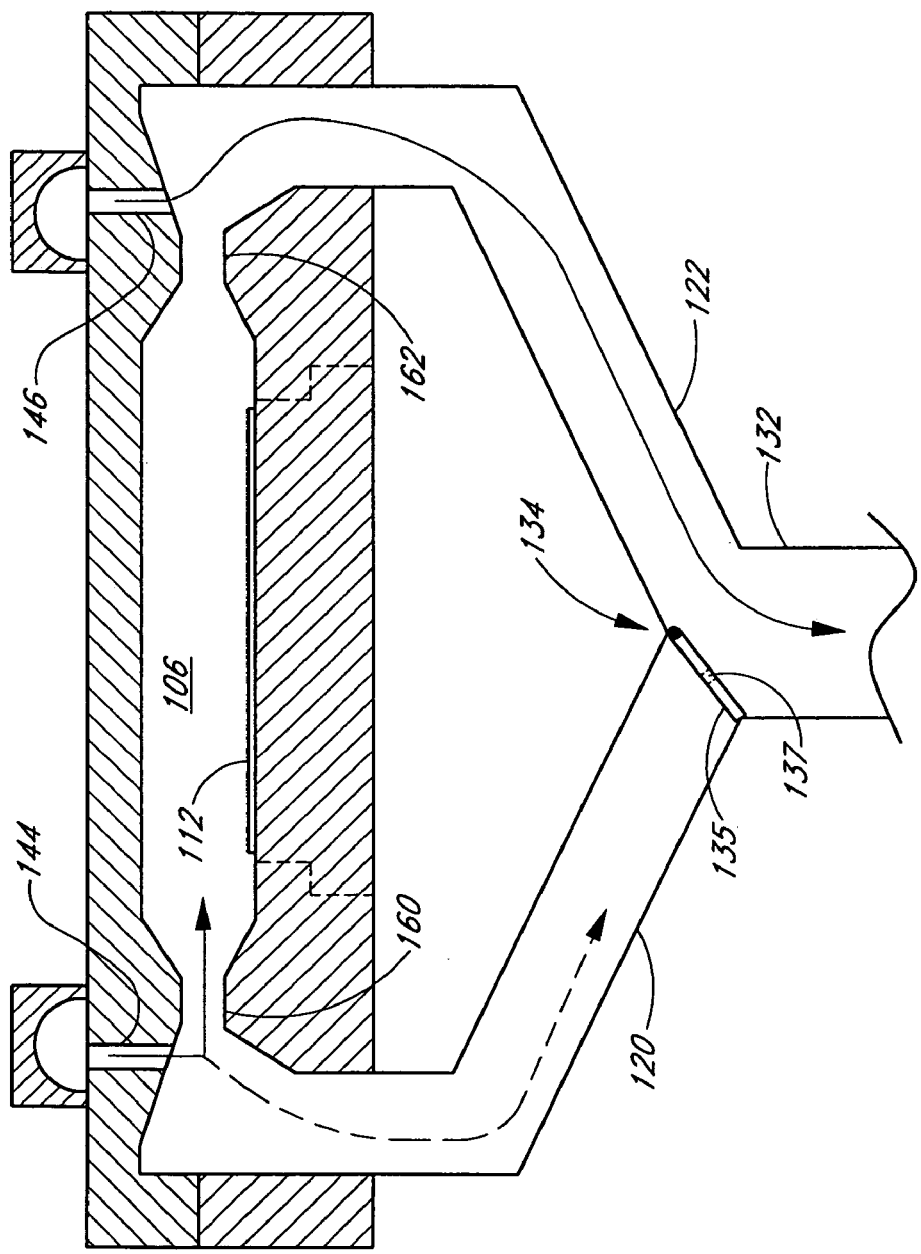
FIGS. 6A–6D are cross-sectional side views of the reactor of FIG. 2 showing the steps of another embodiment of use.

Specifically, FIG. 6A illustrates a first step in which a pulse of a first reactant (e.g., an oxidizer such as $H_2O$) is injected with or without a carrier gas into the reaction chamber 106 through the first discharge opening 144. The flow directing device 134 is positioned such that the exhaust flow through the reaction chamber 106 is biased though the second exhaust duct 122. In one embodiment, this involves substantially closing the first exhaust duct 120 such that only a small opening connects the first duct 120 to the common exhaust duct 132. During this step, a purge gas (e.g., $N_2$) is injected through the second discharge opening 146. As shown in FIG. 6A, because the first exhaust conduit 120 is substantially closed, most of the first reactant is directed into and across the reaction chamber 106 and over the substrate 112 while a small amount of the first reactant flows directly into the closer first exhaust duct 120. Conversely, most of, and preferably substantially all of, the purge gas flows from the second discharge opening 146 directly into the closer second exhaust conduit 122.

Figure 6B:
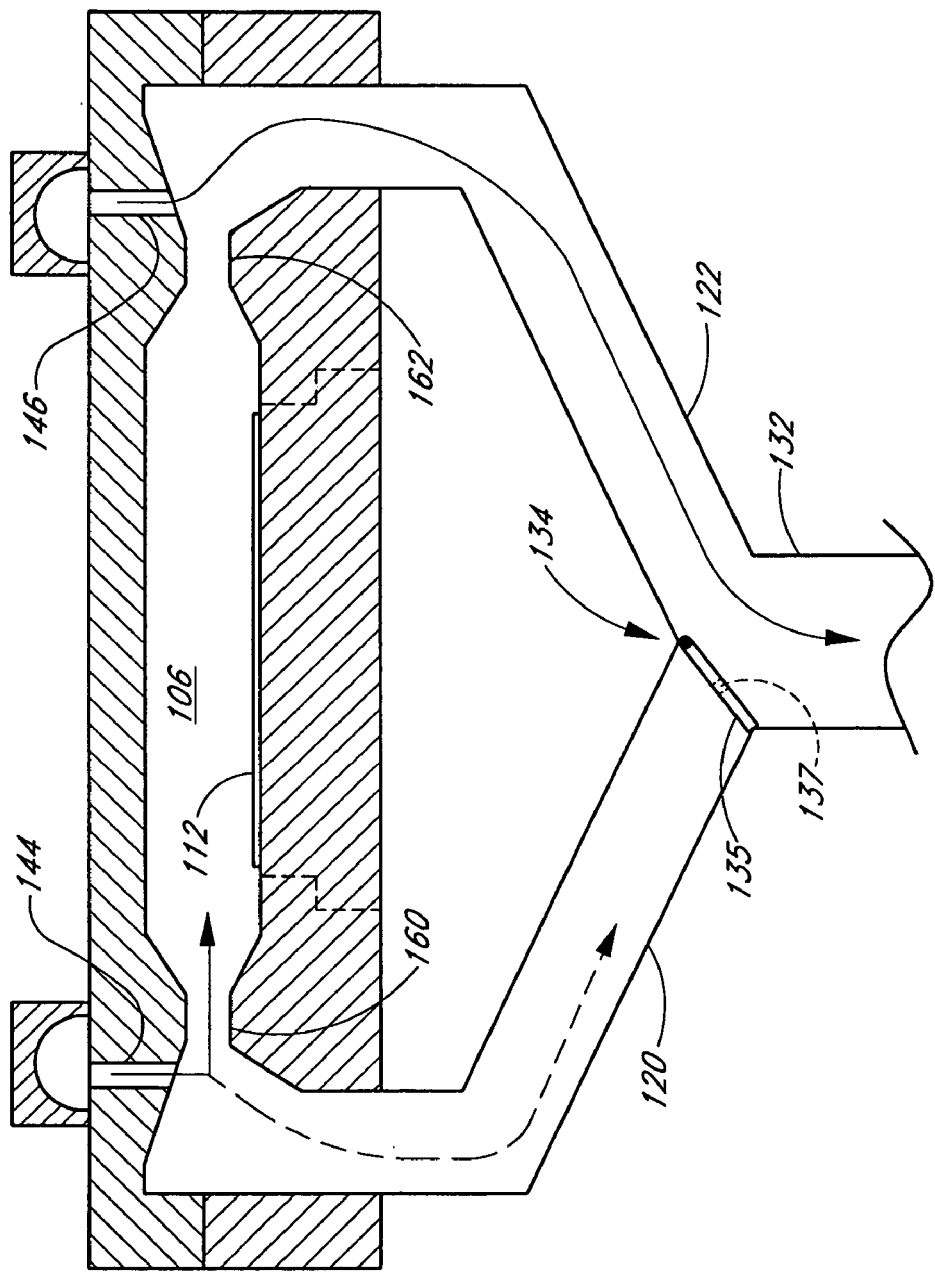

FIG. 6B illustrates a second step in which purge gas is directed through both discharge openings 144, 146. As shown, the flow directing device 134 is preferably positioned such that the exhaust remains biased through the second exhaust duct 122 and that there is only a small opening in the first exhaust duct 120. As mentioned above, purge gas is injected through both discharge openings 144, 146. However, because of the position of the flow directing device 134, the purge gas from the first discharge opening 144 is preferentially directed over the substrate 112. One advantage of this arrangement is that the previous reactant pulse from the first discharge opening 144 is allowed to continue across the substrate 112 before the flow is reversed as described above, maximizing use of the first reactant to ensure saturation. Optionally, during the purging process, the flow directing device 134 may be adjusted such that the exhaust becomes biased through the second exhaust duct 120. In this manner, the direction of the gasses through the reaction chamber 106 may be reversed as the purge gas from the second discharge opening 146 is preferentially directed over the substrate 112. This purge gas tends to be more pure (i.e., less contaminated with reactant) as compared to the purge gas from the first discharge opening 144 because the second discharge opening 146 has been purging during the previous step. This arrangement allows the majority, if not substantially all, of the chemical pulse from the first discharge opening to flow through the reaction chamber 106. The flow in the reaction chamber 106 may then be reversed and purged with the less contaminated purge gas, and a diffusion barrier is set up within the constriction 160 to cut off any further flow of first reactant.

Figure 6C:
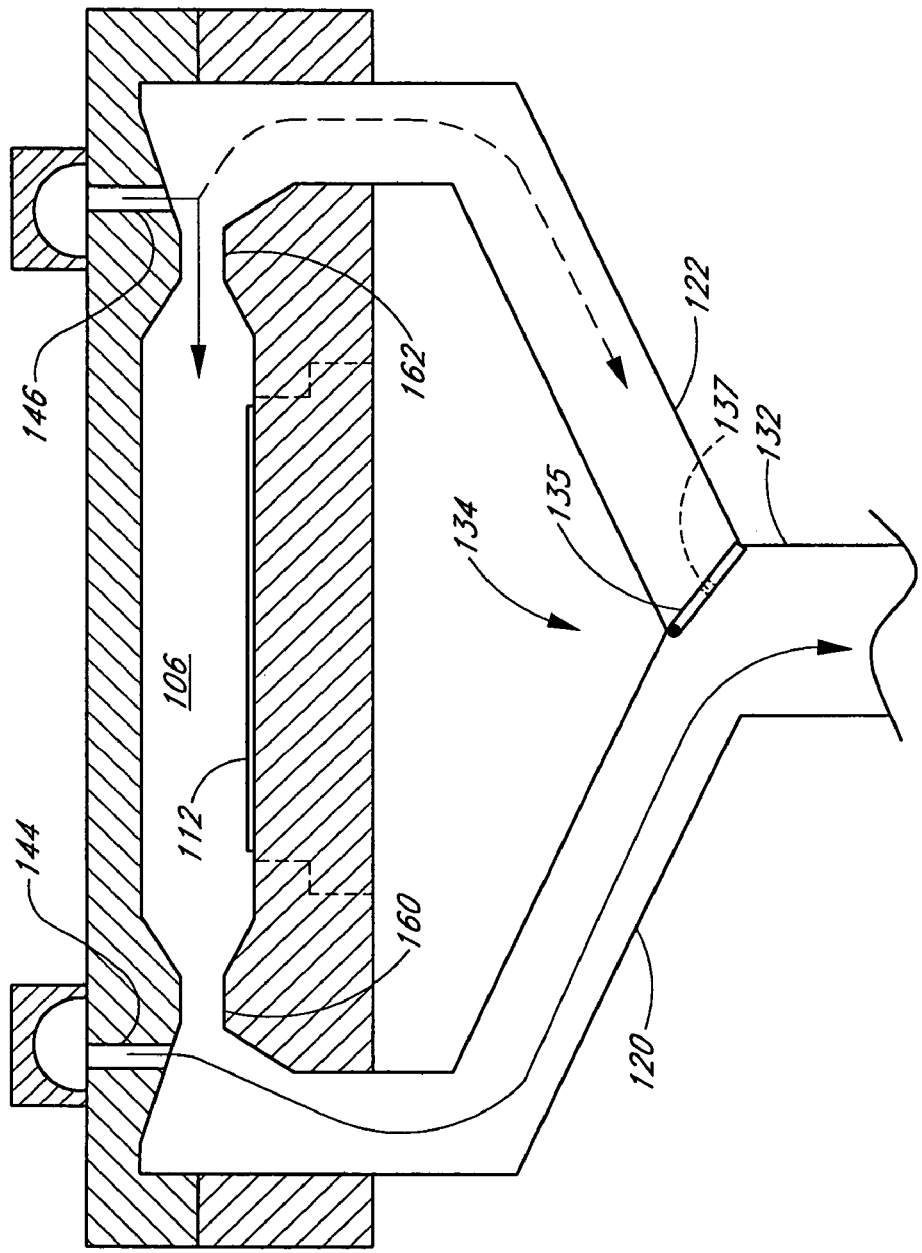

FIG. 6C illustrates a third step in which a pulse of a second reactant (e.g., a metal or $HfCl_4$) is injected into the reaction chamber 106 through the second discharge opening 146 while purge gas is injected through the first discharge opening 144. In this step, the flow directing device 134 may remain in the same or a similar position as the previous step or moved depending on the direction of flow through the reactor has been reversed as described above. For this step, the exhaust gases through the reaction chamber 106 are biased through the first exhaust duct 120. As shown in FIG. 6C, most of the second reactant is directed into the reaction chamber 106 while a smaller amount of the second reactant flows directly into the second exhaust conduit 122. In contrast, most and preferably substantially all of the purge gas through the first discharge opening 144 is directed into the first exhaust conduit 120.

Figure 6D:
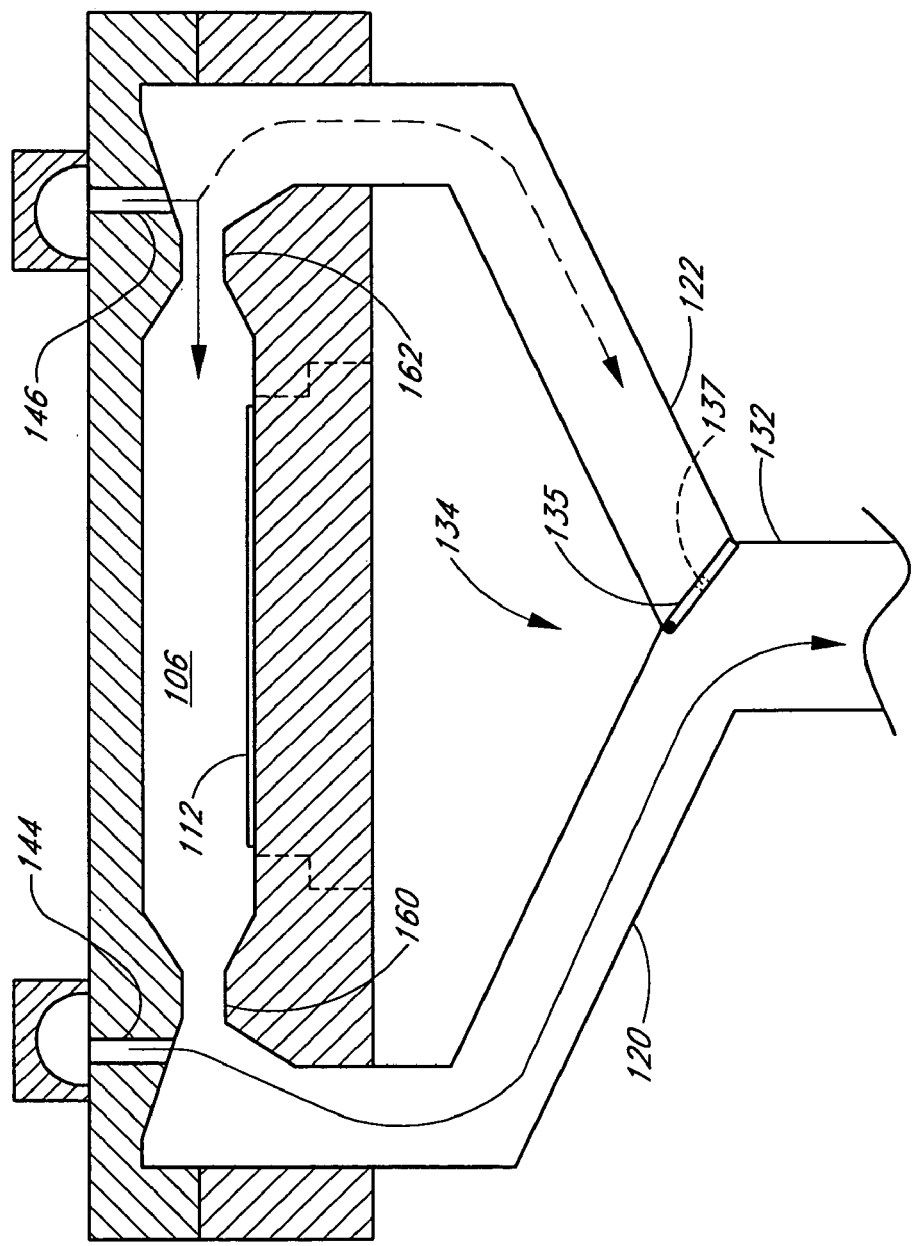
Figure 7:
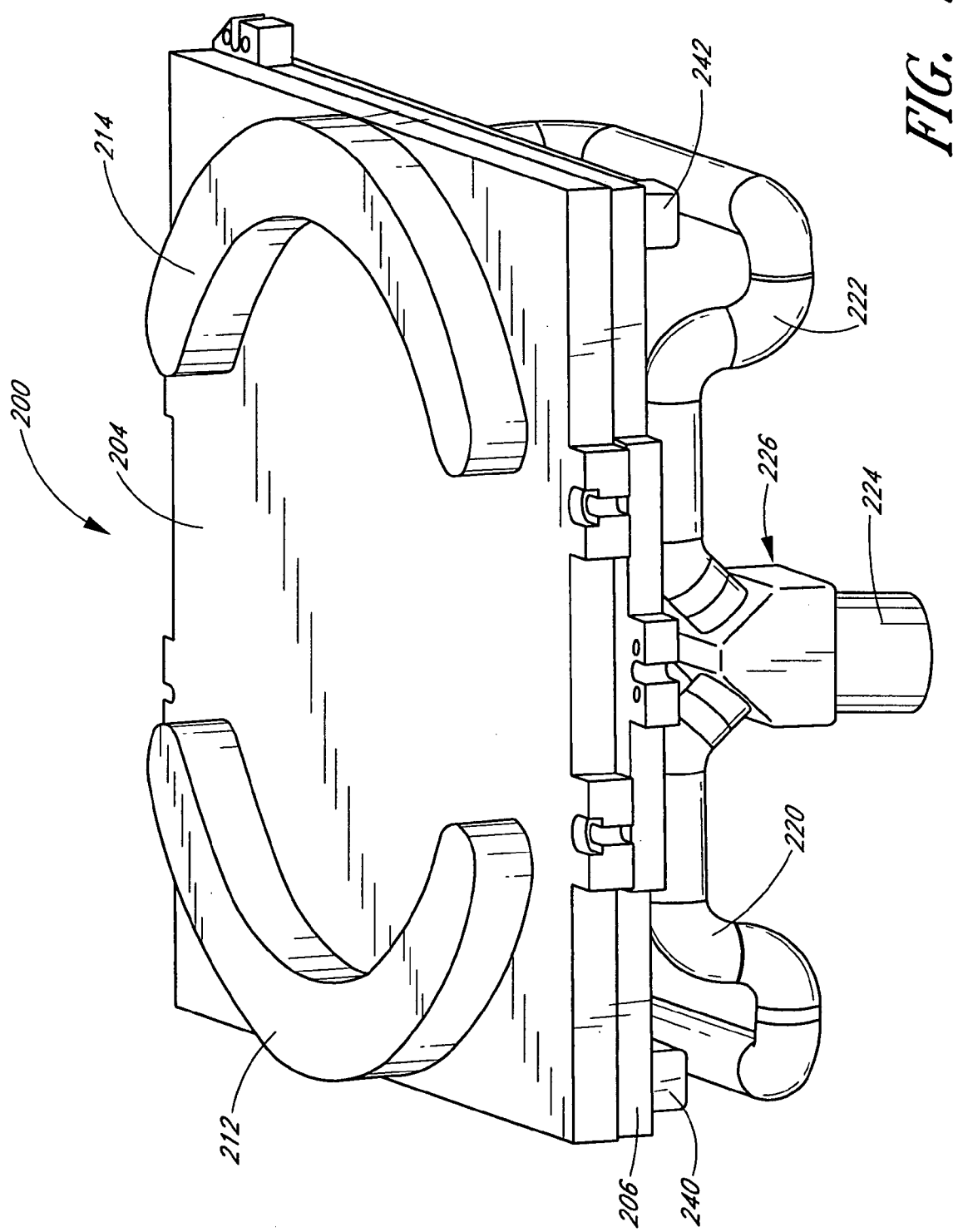
FIG. 7 is a top perspective view of another embodiment of a reactor.
Figure 8:
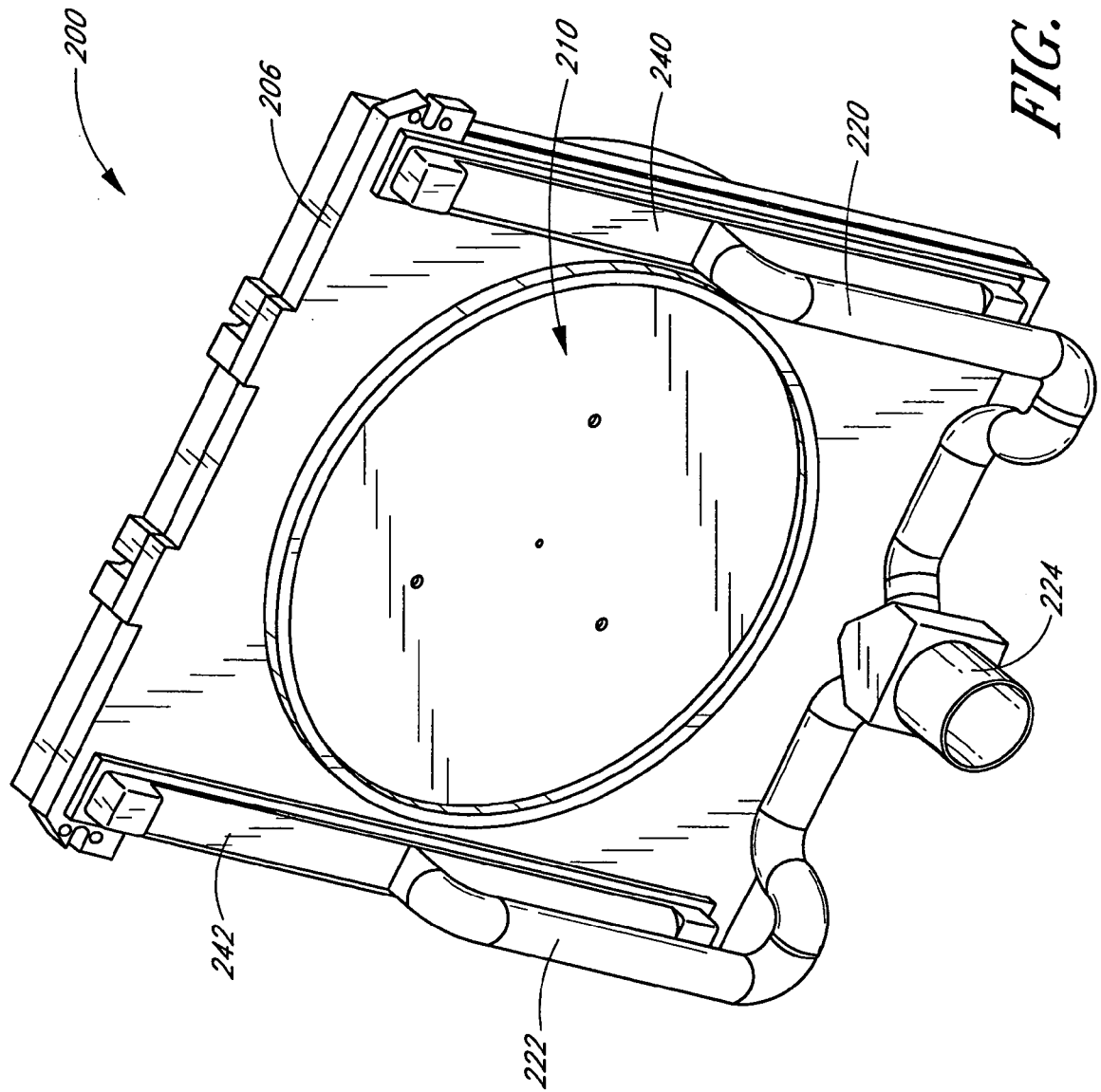
FIG. 8 is a bottom perspective view of the reactor of FIG. 7.
Figure 9:
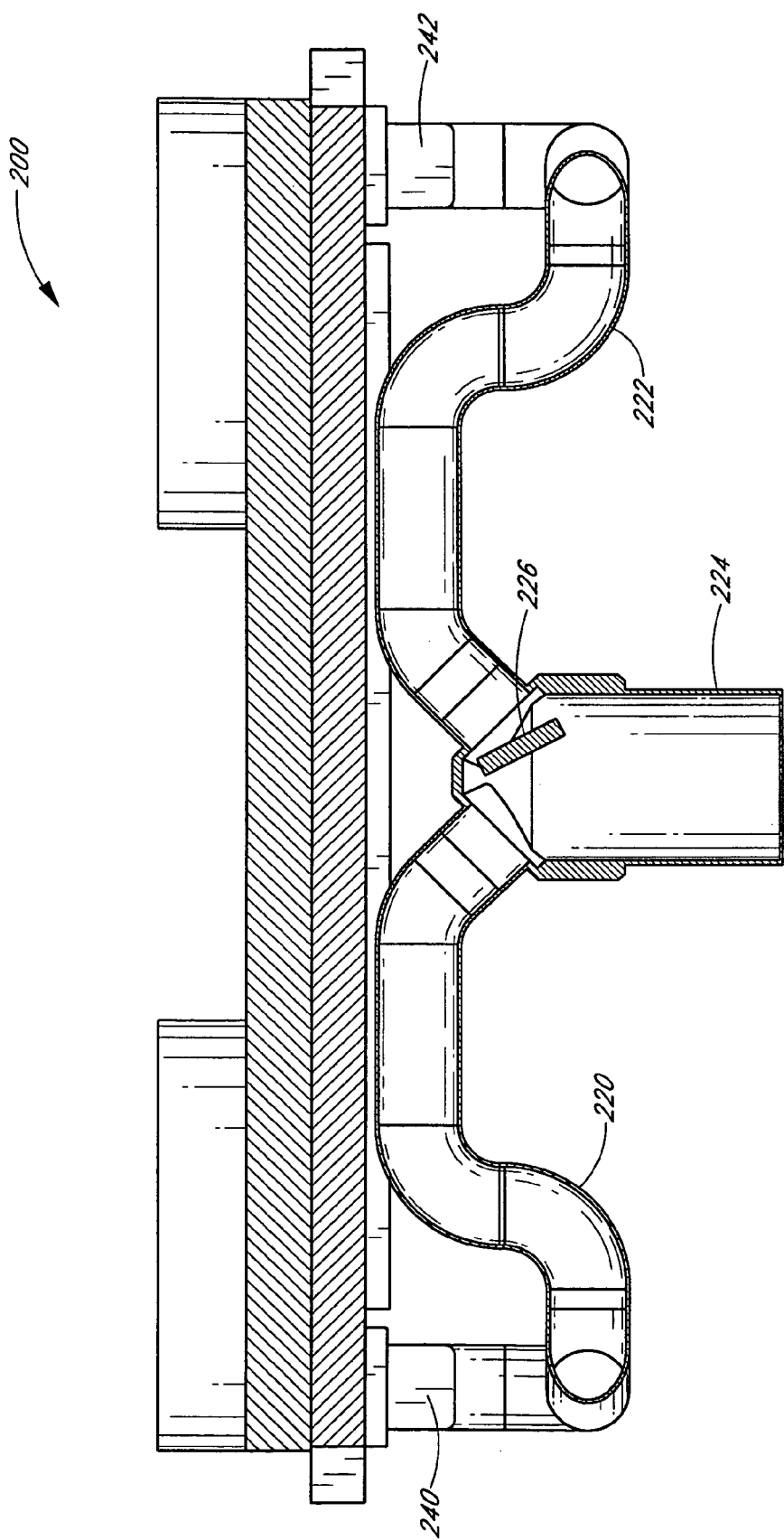
FIG. 9 is a side view of the reactor of FIG. 7.

FIG. 6D illustrates a fourth step in which the reaction chamber 106 is purged with inactive gas through both discharge openings 144, 146. As shown, the flow directing device 134 is preferably positioned such that the exhaust remains biased through the first exhaust duct 120 and that there is only a small opening in the second exhaust duct 122. As mentioned above, purge gas is injected through both discharge openings 144, 146. However, because of the position of the flow directing device 134, the purge gas from the second discharge opening 146 is preferentially directed over the substrate 112. One advantage of this arrangement is that the reactant pulse from the second discharge opening 146 is allowed to continue across the substrate 112 before the flow is reversed as described above, maximizing the use of the second reactant pulse to ensure saturation of reactive sites on the substrate. Optionally, the during the purging process, the flow directly device 134 may be adjusted such that the exhaust becomes biased through the second exhaust duct 122. In this manner, direction of the gasses through the reaction chamber 106 may be reversed as the purge gas from the first discharge opening 144 is now preferentially directed over the substrate 112. This purge gas tends to be more pure (i.e., less contaminated with reactant) as compared to the purge gas from the second discharge opening 146 because the first discharge opening 144 has been purging during the previous step. This arrangement allows the majority, if not substantially all, of the chemical pulse from the second discharge opening 146 to flow through the reaction chamber 106. The flow in the reaction chamber 106 may then be reversed and purged with the less contaminated purge gas and a diffusion barrier is set up within the constriction 162 to cut off any further flow of second reactant into the reaction camber 106.

FIGS. 7–10 illustrate another exemplary embodiment of a reactor 200. This embodiment also includes a reaction chamber 202 defined between a first plate 204 and a base plate 206. See FIG. 10. A substrate is positioned on a susceptor 210, which is moveable in a vertical direction with respect to the base plate 206. A pair of inlet manifolds 212, 214 are provided for supplying a first and a second reactant to the reaction chamber 202. The inlet manifolds 212, 214 are connected to inlet conduits (not shown) and terminate in a plurality of openings 213, 215 so as to distribute the reactants across the reaction chamber 202. In this embodiment, the inlet manifolds 212, 214 are contoured and openings 213, 215 distributed so as to generally match the shape of the front or rear edge of the substrate. As such, in the illustrated arrangement the manifold 212, 214, and openings 213, 215, are curved so that the openings 213, 215 are positioned approximately an equal distance from the edge of a circular substrate and therefore, the gases coming into the reactor are more likely to wafer leading edge coincidentally.

As with the previous embodiment, the reaction chamber 202 is in communication with a pair of exhaust conduits 220, 222 that merge into a common exhaust conduit 224. See especially FIG. 9. A flow direction device 226 (e.g., a high speed differential flapper valve) is positioned at the junction between the first and second exhaust conduits 220, 222 so as to preferentially direct flow through each conduit. Each exhaust conduit 220, 222 is associated with an exhaust manifold 240, 242, which terminate at exhaust outlets 244, 246 that may be formed in the base plate 206.

Figure 10:
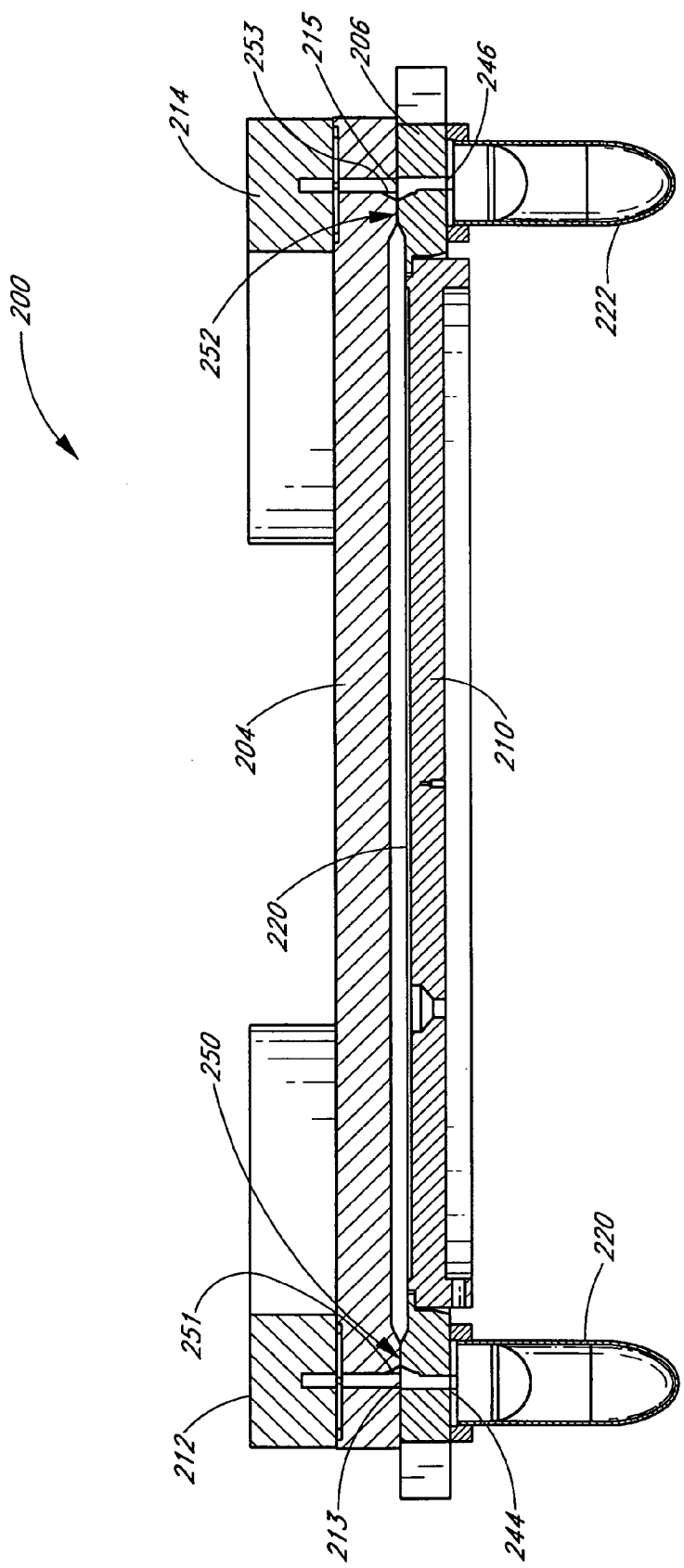
FIG. 10 is a cross-sectional side view of the reactor of FIG. 7.
Figure 10A:
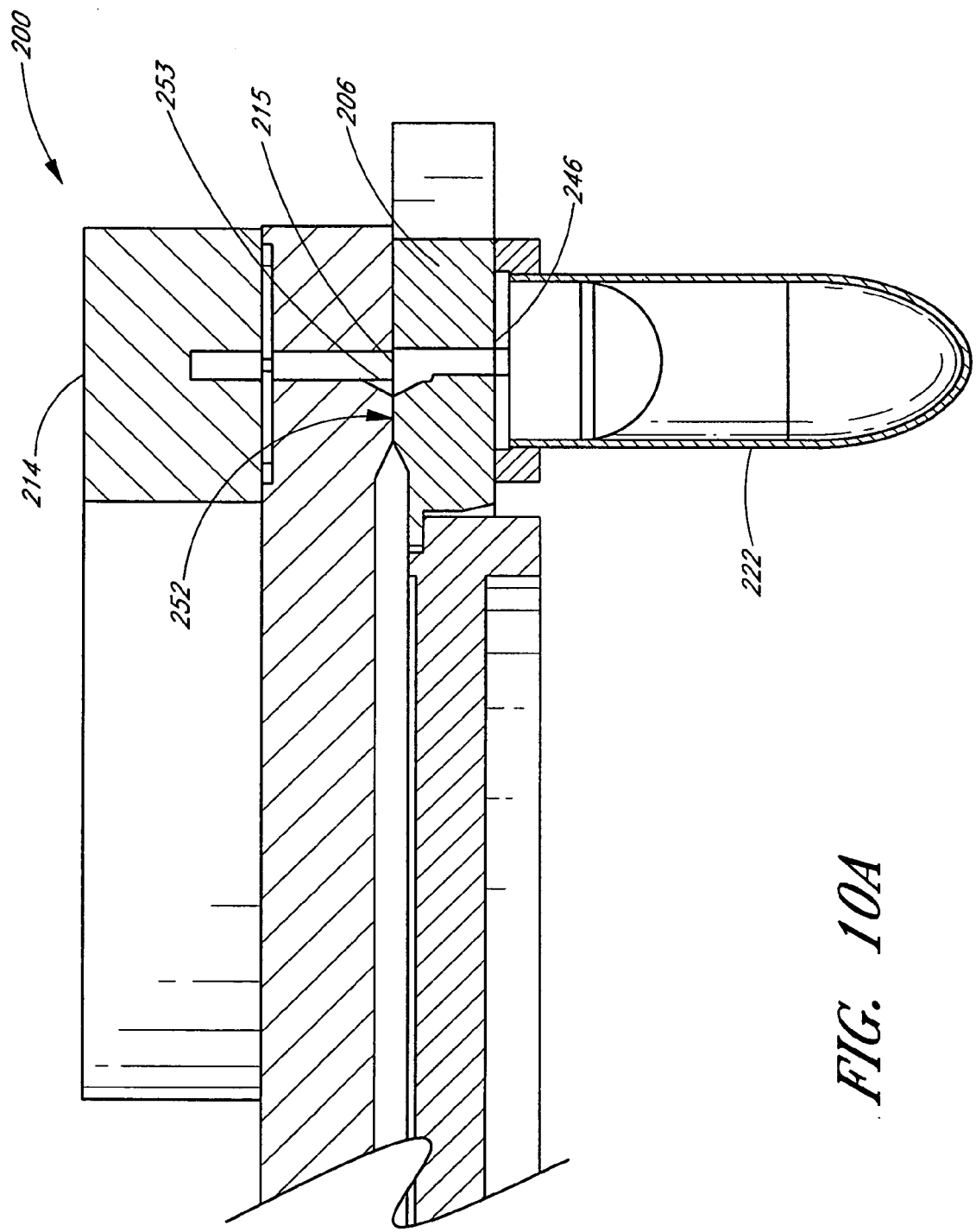
FIG. 10A is a closer view of the right hand portion of FIG. 7.

As seen in FIG. 10, the first exhaust outlet 244 is paired with the first discharge opening 213 and the second exhaust outlet 246 is paired with the second discharge opening 215. Each pair of discharge openings and exhaust openings communicate with sub-chambers 251, 253, which are separated from the reaction chamber by flow restrictions 250, 252. In the illustrated embodiment, these flow restrictions 250, 252 are defined by protrusions in the top and base plates 204, 206. In addition, in the exemplary reactor 200, the exhaust outlets 244, 246 are located generally below the corresponding discharge opening 213, 215, i.e., approximately equidistant from the substrate edge. As with the previous embodiment, the reactor 200 may be provided with transition zones upstream and downstream of the flow restrictions 250, 252. The flow restrictions 250, 252 in this embodiment are generally located an equal distance from the edge of the substrate along their width. As such, with a circular substrate, the flow restrictions 250, 252 have a generally curved shape.

It should be appreciated that the apparatus and methods described above can be employed in any gas phase process including, but not limited to, etching and chemical vapor deposition (CVD). However, it is particularly suited for use in ALD reactors because, as explained above, it is particularly important to prevent precursor mixing in ALD reactors.

The assemblies described above may be used with a large number of solid precursors, such as metal compounds, such as metal halides, organometallic compounds comprising metal-to-carbon bonds, metalorganic compounds, which do not comprise a metal-to-carbon bond but which contain carbon (e g., thd compounds), and elemental metals. Also oxidizing and reducing agents may be used, such as, for example ozone, oxygen, water, ammonia, hydrogen, TEB, alcohols, etc.

Although this invention has been disclosed in the context of certain preferred embodiments and exemplary embodiments, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. It is also contemplated that various combination or subcombinations of the specific features and aspects of the embodiments may be made and still fall within the scope of the invention. Accordingly, it should be understood that various features and aspects of the disclosed embodiments can be combine with or substituted for one another in order to form varying modes of the disclosed invention. Thus, it is intended that the scope of the present invention herein disclosed should not be limited by the particular disclosed embodiments described above.

We claim:

1. A reactor that defines a reaction chamber for processing a substrate, the reactor comprising:
   A first inlet for providing a first reactant and to the reaction chamber;
   A second inlet for a second reactant to the reaction chamber;
   A first exhaust outlet for removing gases from the reaction chamber;
   A second exhaust outlet for removing gases from the reaction chamber;
   A flow control system configured to alternately constrict flow through the first and second exhaust outlets
   Wherein a first flow restriction divides the first inlet and first exhaust outlet from the reaction chamber and a second flow restriction divides the second inlet and the second exhaust outlet from the reaction chamber and wherein the reactor is configured such that when the first exhaust outlet is in an un-constricted condition and the second exhaust outlet is in a constriction condition, flow from the second inlet is directed through the reaction chamber, over the substrate to the first exhaust outlet and forms a diffusion barrier at least partially within the first flow restriction between the first inlet and the substrate.

2. The reactor as in claim 1, wherein the reactor is configured such that when the first exhaust outlet is in a restricted condition and the second exhaust outlet is in an un-restricted condition, flow from the first inlet is directed through the reaction chamber, over the substrate and into the second exhaust outlet and forms a diffusion barrier between the second inlet and the substrate.

3. The reactor as in claim 1, wherein the reactor is an ALD reactor.

4. The reactor as in claim 1, wherein the first inlet and first outlet are positioned on one side of the reactor and the second inlet and the second outlet are on another side of the reactor.

5. The reactor as in claim 4, wherein the first inlet and first outlet are on an opposite side of the reactor from the second inlet and the second outlet.

6. The reactor as in claim 5, wherein the first inlet is positioned substantially above the first outlet.

7. The reactor as in claim 6, wherein the diffusion barrier is positioned, at least partially, in the first flow restriction.

8. The reactor as in claim 1, wherein the first and second exhaust outlets are in communication with a common exhaust line.

9. The reactor as in claim 8, wherein a valve provided to selectively bias the flow of exhaust from the first and second exhaust outlets to the common exhaust line.

10. The reactor as in claim 9, wherein the first and second exhaust outlets each include flow restrictions for increasing the velocity of fluid flowing through the first and second outlets respectively.

11. A method for growing thin films onto a surface of a substrate by exposing the substrate to alternately repeated surface reactions of vapor-phase reactants, the method comprising:
   providing a reactor having a reaction chamber, a first inlet, a second inlet, a first exhaust outlet and a second exhaust outlet;
   during a first reactant pulse, (i) feeding a first reactant stream through the reaction chamber via the first inlet while a fraction of the first reactant stream is allowed to by-pass a substrate in the reaction chamber by exiting via the first exhaust outlet (ii) feeding an inactive gas into the second exhaust outlet through the second inlet and (iii) withdrawing the first reactant stream from the reaction chamber through the second exhaust outlet; and
   during a removal process, (i) feeding inactive gas into the reaction chamber via the second inlet while inactive gas is fed into the first exhaust outlet through the first inlet and (ii) withdrawing the inactive gas from the reaction chamber via the first outlet to form a diffusion barrier between the first inlet and the substrate positioned within the reaction chamber.

12. The method of claim 11, further comprising: during a second reactant pulse, (i) feeding a second reactant stream through the reaction chamber via the second inlet while a fraction of the second reactant stream is allowed to by-pass the substrate in the reaction chamber by exiting via the second exhaust outlet (ii) feeding an inactive gas into the first exhaust outlet through the first inlet and (iii) withdrawing the second reactant stream from the reaction chamber through the first exhaust outlet.

13. The method of claim 12, during a second removal process, (i) feeding inactive gas into the reaction chamber via the first inlet while inactive gas is fed into the second exhaust outlet through the second inlet and (ii) withdrawing the inactive gas from the reaction chamber via the second outlet to form a diffusion barrier between the second inlet and the substrate positioned within the reaction chamber.

14. The method of claim 12, wherein the step of feeding a first reactant stream through the reaction chamber via the first inlet while a fraction of the first reactant stream is allowed to by-pass a substrate in the reaction chamber by exiting via the first exhaust outlet comprises by-passing about 10% to about 25% of the first reactant stream.

15. The method of claim 12, wherein the removal process further comprises (i) feeding an inactive gas into the reaction chamber via the first inlet while inactive gas is fed into the second exhaust outlet through the second inlet and (ii) a withdrawing the inactive gas from the reaction chamber via the second outlet.

16. The method of claim 12, wherein the steps of: (i) feeding an inactive gas into the reaction chamber via the first inlet while inactive gas is fed into the second exhaust outlet through the second inlet and (ii) a withdrawing the inactive gas from the reaction chamber via the second outlet occur before the steps of: (i) feeding inactive gas into the reaction chamber via the second inlet while inactive gas is fed into the first exhaust outlet through the first inlet and (ii) withdrawing the inactive gas from the reaction chamber via the first outlet to form a diffusion barrier between the first inlet and the substrate positioned within the reaction chamber.

17. A method for growing thin films onto a surface of a substrate by exposing the substrate to alternately repeated surface reactions of vapor-phase reactants, the method comprising:

providing a reactor having a reaction chamber, a first inlet, a second inlet, a first exhaust outlet and a second exhaust outlet;

during a first reactant pulse, (i) feeding a first reactant stream through the reaction chamber via the first inlet while a fraction of the first reactant stream is allowed to by-pass a substrate in the reaction chamber by exiting via the first exhaust outlet (ii) feeding an inactive gas into the second exhaust outlet through the second inlet and (iii) withdrawing the first reactant stream from the reaction chamber through the second exhaust outlet; and during a removal process, (i) feeding inactive gas into the reaction chamber via the first inlet while inactive gas is fed into the second exhaust outlet through the second inlet and (ii) withdrawing the inactive gas from the reaction chamber via the second exhaust outlet to form a diffusion barrier between the second inlet and the substrate positioned within the reaction chamber.

18. A method for processing a substrate using atomic layer deposition, the method comprising:

providing a reaction chamber including a first reactant inlet port, a second reactant inlet port, a first exhaust outlet port, and a second exhaust outlet port;

loading a substrate into the reaction chamber;

injecting a first reactant into the reaction chamber through the first reactant inlet port and over the substrate in a first direction;

withdrawing the first reactant from the reaction chamber through the second exhaust port;

injecting a purging gas through the second reactant inlet port and over the substrate in a second direction;

withdrawing the purging gas from the reaction chamber through the first exhaust port;

injecting a second reactant into the reaction chamber through the second reactant port and over the substrate in the second direction; and withdrawing the second reactant from the reaction chamber through the first exhaust port.

19. The method of claim 18, wherein the step of injecting a first reactant into the reaction chamber includes by-passing about 10% to about 25% of the first reactant stream into the first exhaust port.

20. A substrate processing system, comprising:

a reactor including a reaction chamber, a first inlet port, a second inlet port, a first exhaust port, a second exhaust port, a first flow restriction dividing the reaction chamber from the first inlet port and the first exhaust port and a second flow restriction dividing the reaction chamber form the second inlet port and the second exhaust port;

wherein the first inlet port and the second exhaust port cooperate to provide gas flow in the reaction chamber in a first direction forming a diffusion barrier in the second flow restriction between the second inlet port and the reaction chamber; and wherein the second inlet port and the first exhaust port cooperate to provide gas flow in a second direction forming a diffusion barrier in the first flow restriction between the first inlet port and the reaction chamber.

21. The substrate processing system of claim 20, wherein the first and second directions are substantially opposite or each other.

22. A method for processing a substrate using atomic layer deposition, the method comprising:

in a first reactant pulse, directing the flow of a first reactant into a reaction chamber and over a substrate in a first direction;

in a purging pulse, directing a purging gas into the reaction chamber and over the substrate in a second direction;

in a second reactant pulse, directing a second reactant into the reaction chamber and over the substrate in the second direction; and in a second purging pulse, directing the purging gas into the reaction chamber and over the substrate in the first direction.

23. A method of processing a substrate, comprising:

providing a reactor including a reaction chamber, a first inlet port, a second inlet port, a first exhaust port, a second exhaust port, and a first flow restriction dividing the reaction chamber from the first inlet port and the first exhaust port and a second flow restriction dividing the reaction chamber form the second inlet port and the second exhaust port;

directing a second reactant into the reaction chamber through the second inlet port and forming a diffusion barrier between the first inlet port and the reaction chamber in the first flow restriction; and directing a first reactant into the reaction chamber through the first inlet port and forming a diffusion barrier between the second inlet port and the reaction chamber in the second flow restriction.

* * * * *